(12) United States Patent  (10) Patent No.: US 8,448,100 B1
Lin et al.  (45) Date of Patent: May 21, 2013

(54) TOOL AND METHOD FOR ELIMINATING MULTI-PATTERNING CONFLICTS

(75) Inventors: Hung Lung Lin, Hsinchu (TW); Chin-Chang Hsu, Banqiao (TW); Ying-Yu Shen, Chiayi (TW); Wen-Ju Yang, Hsinchu (TW); Hsiao-Shu Chao, Baoshan Township, Hsinchu County (TW); Yi-Kan Cheng, Taipei (TW); Chin-Hsiung Hsu, Guanyin Township, Taoyuan County (TW); Huang-Yu Chen, Zhudong Township, Hsinchu County (TW); Yi-Chuin Tsai, Sing-yan Township, Pingtung County (TW); Yuan-Te Hou, Hsinchu (TW); Chung-Hsing Wang, Baoshan Township, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/444,158

(22) Filed: Apr. 11, 2012

(51) Int. Cl.
*G06F 17/50* (2006.01)

(52) U.S. Cl.
USPC ............... 716/54; 716/50; 716/51; 716/52; 716/53; 716/55

(58) Field of Classification Search
USPC ............................ 716/50, 51, 52, 53, 54, 55
See application file for complete search history.

(56) References Cited

U.S. PATENT DOCUMENTS

| | | |
|---|---|---|
| 5,933,759 A | 8/1999 | Nguyen et al. |
| 6,195,593 B1 | 2/2001 | Nguyen |
| 6,242,352 B1 | 6/2001 | Chen et al. |
| 6,446,248 B1 | 9/2002 | Solomon et al. |
| 6,462,818 B1 | 10/2002 | Bareket |
| 6,486,954 B1 | 11/2002 | Mieher et al. |
| 6,734,971 B2 | 5/2004 | Smith et al. |
| 7,379,184 B2 | 5/2008 | Smith et al. |
| 7,531,449 B2 | 5/2009 | Park et al. |

(Continued)

FOREIGN PATENT DOCUMENTS

JP 3504743 10/1991

OTHER PUBLICATIONS

M. Cho et al., Double Patterning Technology Friendly Detailed Routing, IEEE/ACM International Conference on Computer-Aided Design, pp. 506-511, Nov. 2008.

(Continued)

*Primary Examiner* — Thuan Do
*Assistant Examiner* — Brian Ngo
(74) *Attorney, Agent, or Firm* — Duane Morris LLP

(57) ABSTRACT

A computer implemented system comprises: a tangible, non-transitory computer readable storage medium encoded with data representing an initial layout of an integrated circuit pattern layer having a plurality of polygons. A special-purpose computer is configured to perform the steps of: analyzing in the initial layout of an integrated circuit pattern layer having a plurality of polygons, so as to identify a plurality of multi-patterning conflict cycles in the initial layout; constructing in the computer a respective multi-patterning conflict cycle graph representing each identified multi-patterning conflict cycle; classifying each identified multi-patterning conflict cycle graph in the computer according to a number of other multi-patterning conflict cycle graphs which enclose that multi-patterning conflict cycle graph; and causing a display device to graphically display the plurality of multi-patterning conflict cycle graphs according to their respective classifications.

18 Claims, 22 Drawing Sheets

U.S. PATENT DOCUMENTS

| | | | |
|---|---|---|---|
| 7,685,555 | B1 | 3/2010 | Bertrand et al. |
| 7,879,727 | B2 | 2/2011 | Postnikov et al. |
| 7,906,253 | B2 | 3/2011 | Aton et al. |
| 2003/0140325 | A1 | 7/2003 | Chen et al. |
| 2004/0004726 | A1 | 1/2004 | Sezginer et al. |
| 2004/0068712 | A1* | 4/2004 | Heng et al. .................. 716/21 |
| 2006/0197950 | A1 | 9/2006 | Smith et al. |
| 2007/0212648 | A1 | 9/2007 | Lalbahadoersing et al. |
| 2008/0244504 | A1 | 10/2008 | Drapeau et al. |
| 2009/0068843 | A1 | 3/2009 | Yang |
| 2009/0087619 | A1 | 4/2009 | Aton et al. |
| 2009/0125866 | A1* | 5/2009 | Wang et al. ..................... 716/19 |
| 2010/0176479 | A1 | 7/2010 | Postnikov et al. |
| 2010/0325595 | A1 | 12/2010 | Song et al. |
| 2011/0004858 | A1* | 1/2011 | Chang et al. ................ 716/122 |
| 2011/0023002 | A1 | 1/2011 | Cheng et al. |
| 2011/0119648 | A1* | 5/2011 | Chen et al. .................... 716/126 |
| 2011/0193234 | A1 | 8/2011 | Chen et al. |

OTHER PUBLICATIONS

R. Kruif et al., Wafer Based Mask Characterization for Double Patterning Lithography, 24th European Mask and Lithography Conference, pp. 71-82, Jan. 2008.

K. Bubke et al., Mask Characterization for Double Patterning Lithography, Journal of Micro/Nanolithography, MEMS and MOEMS, 10 pages, Jan. 2009.

Mitra et al., Radar: RET-Aware Detailed Routing Using Fast Lithography Simulations, Proceedings of the 42nd Design Automation Conference, pp. 369-372, Jun. 2005.

Bencher, C., et al., "22nm Half-Pitch Patterning by CVD Spacer Self Alignment Double Patterning (SADP)", Proc. of SPIE, 2008, 6924:69244E-1 through 69244E-7.

Ercken, M. et al., "Effects of different processing conditions on line-edge roughness for 193nm and 157nm resists", Metrology, Inspection, and Process Control for Microlithography XVIII. Edited by R.M. Silver, Proceedings of the SPIE, 2004, 5375:266-275.

Smith, N. et al., "For semiconductor manufacture, pattern alignment requires subnanometer uncertainty", SPIE Newsroom, 10.1117/2.1200802.1036, Feb. 26, 2008, 3 pages.

Tachyon™ DDL and Tachyon™ DPT, A Comprehensive Low-K, Computational Lithography Solution, 2008 Brion Technologies, Inc., 4 pages.

"Calibre Pattern Matching", Physical Verification Datasheet, 2010 Mentor Graphics Corporation, 2 pages.

Bencher, C., "An Assessment of Patterning Options for 15nm Half-Pitch", 2011 International Symposium on VLSI Technology, Systems and Applicationws (VLSI-TSA), Apr. 2011, 2 pages.

Kang, J.H. et al., "Combination of rule and pattern based on lithography unfriendly pattern detection in OPC flow", Proc. of SPIE, 2008, 7122, pp. 71221N-1 through 71221N-8.

Smith, S. et al., "Post-Lithography Layout Prediction Based on Pattern Matching of Primitive Structures" Optimization Issues in VLSI CAD, Fall 2007, 7 pages.

Chang, K.H. et al., Paper "Reap What You Sow: Spare Cells for Post-Silicon Metal Fix", University of Michigan, EECS Department, Ann Arbor, MI, 2008, 8 pages.

U.S. Appl. No. 12/097,640, filed Oct. 19, 2010.

* cited by examiner

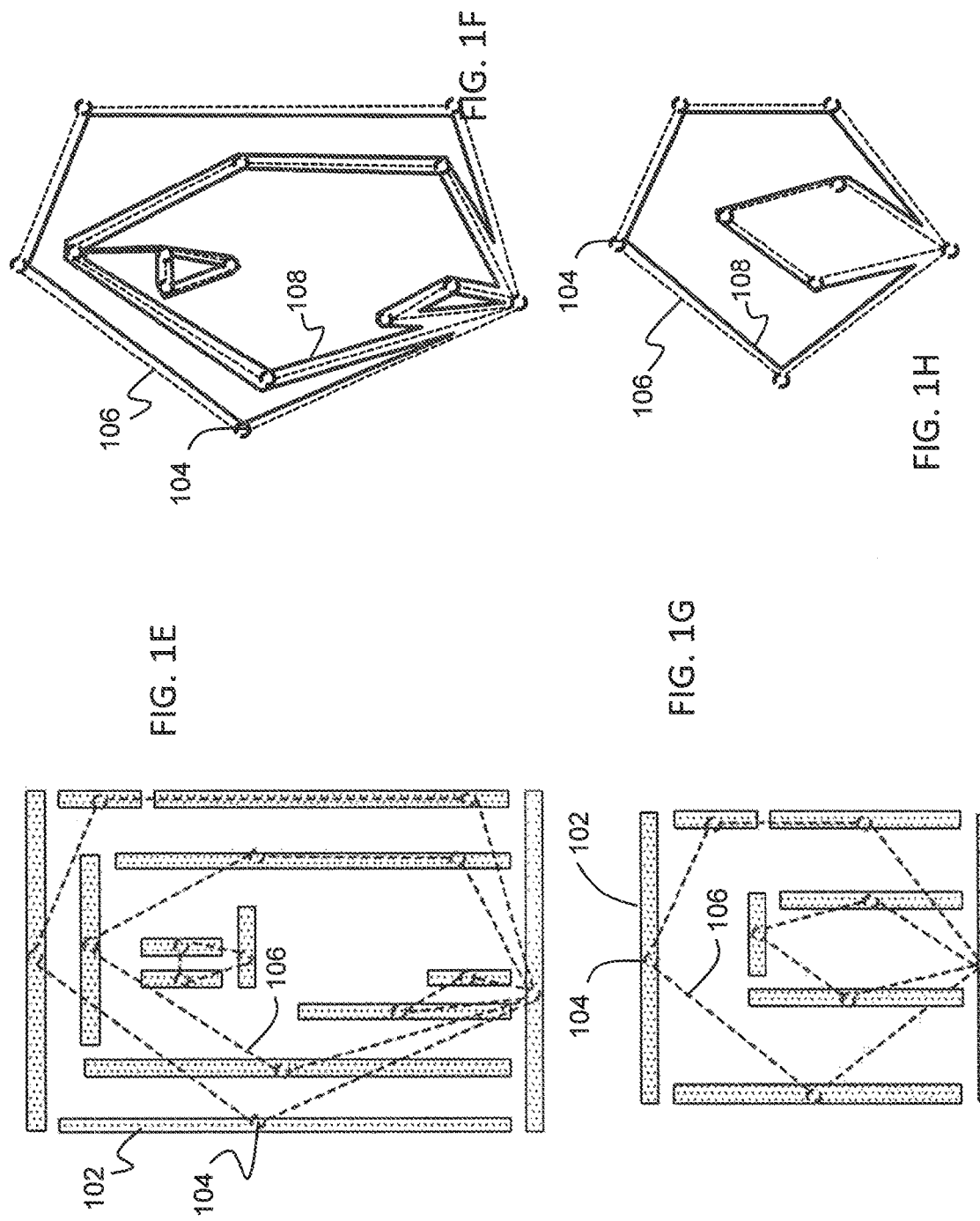

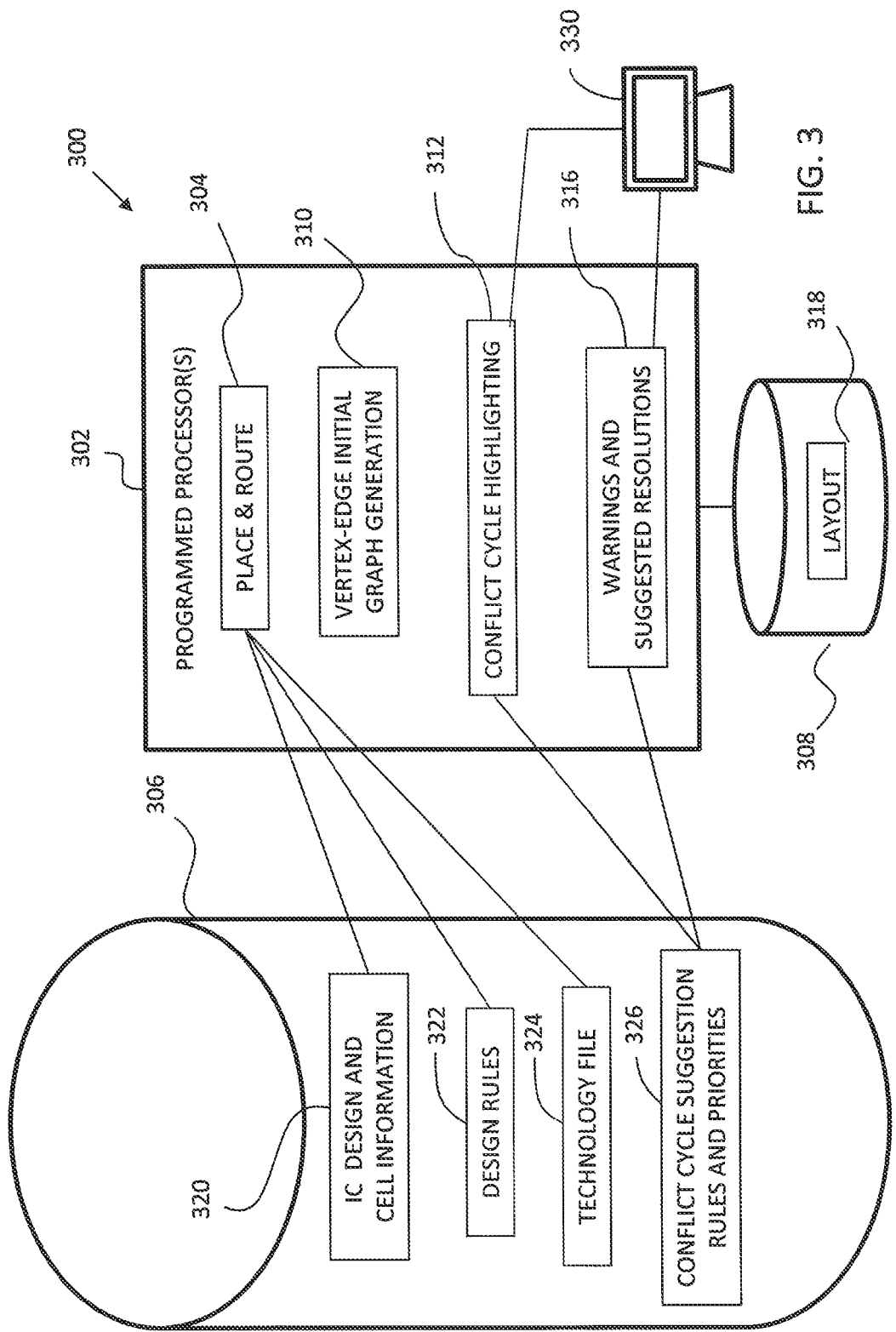

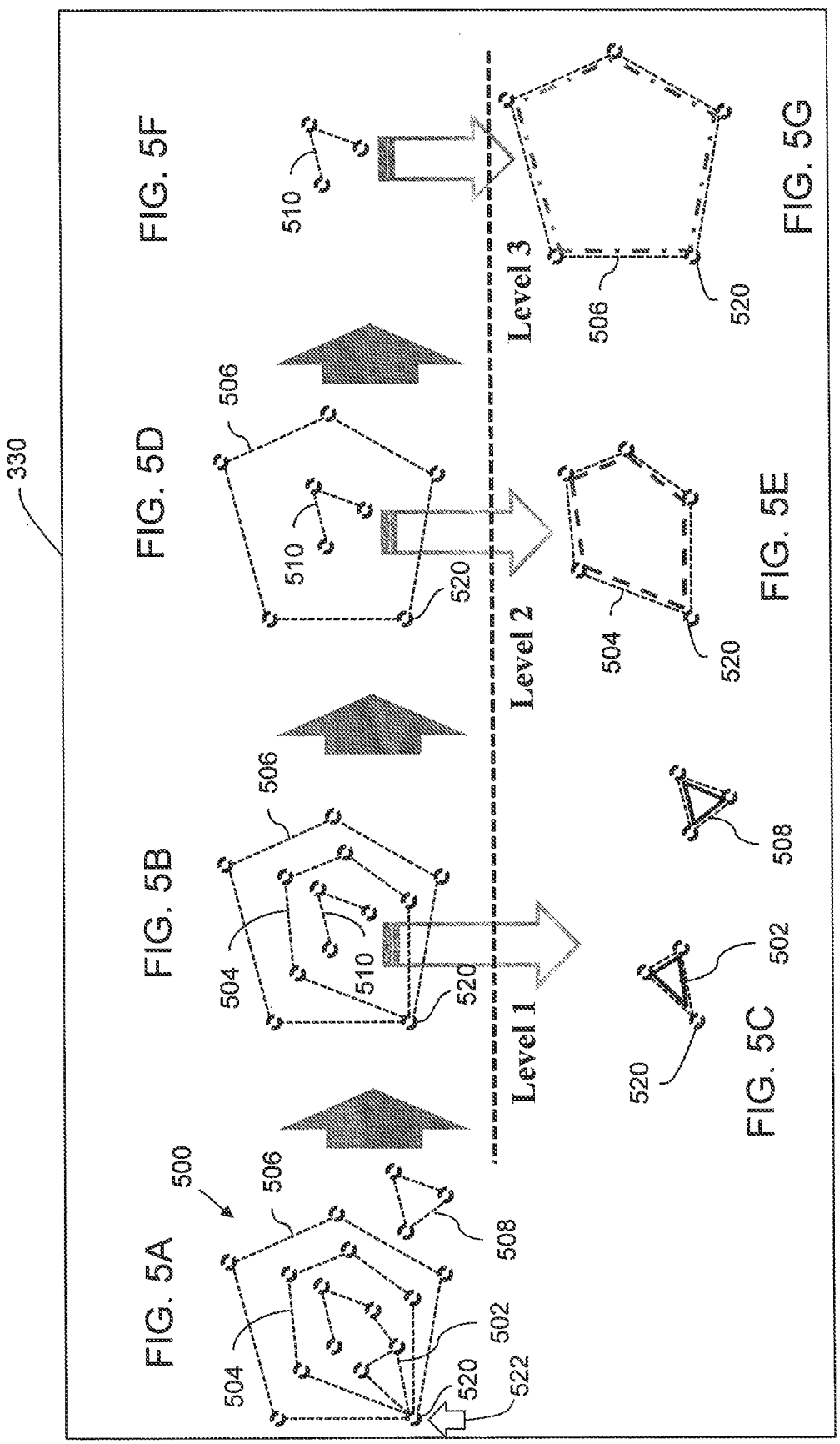

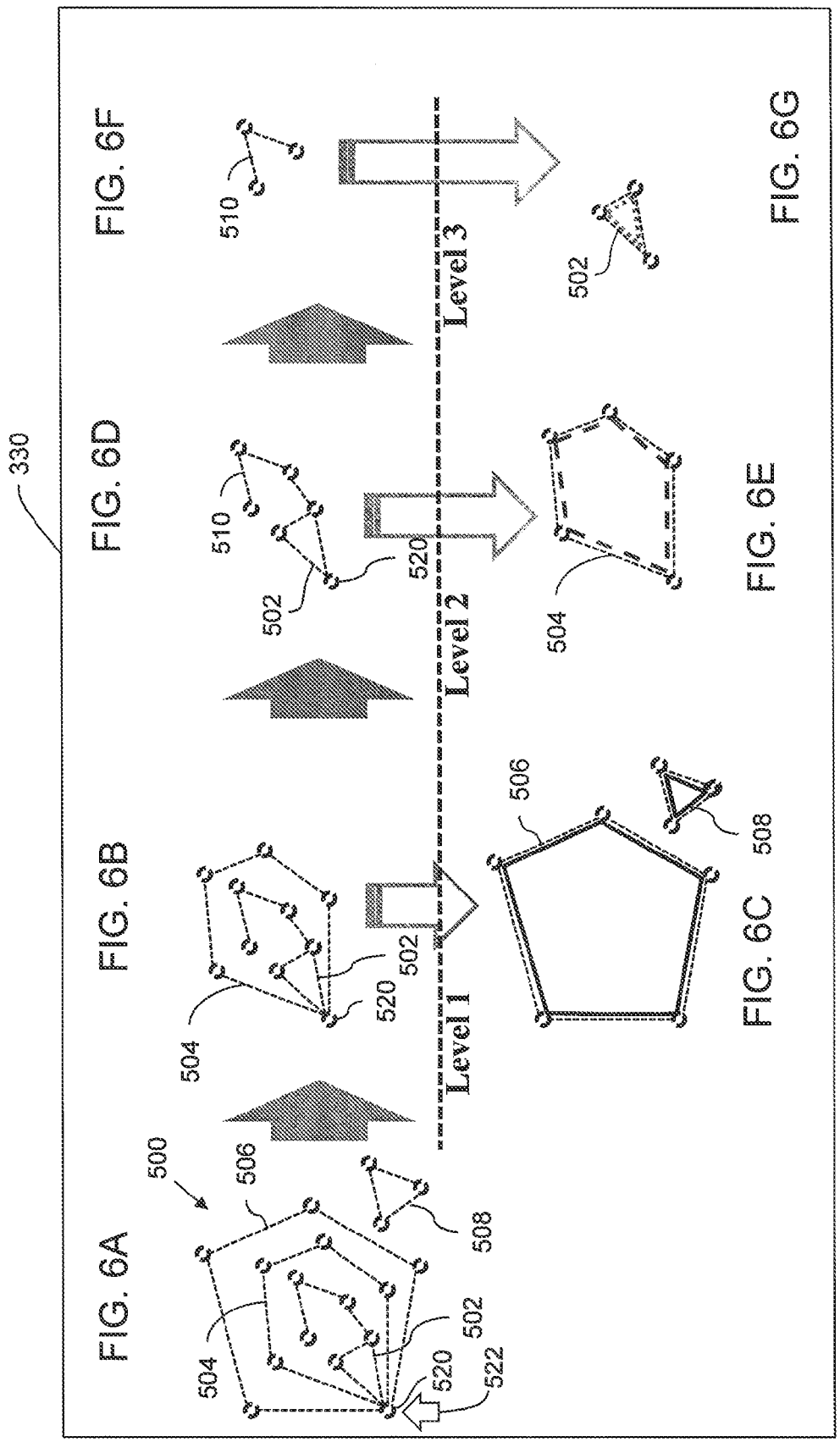

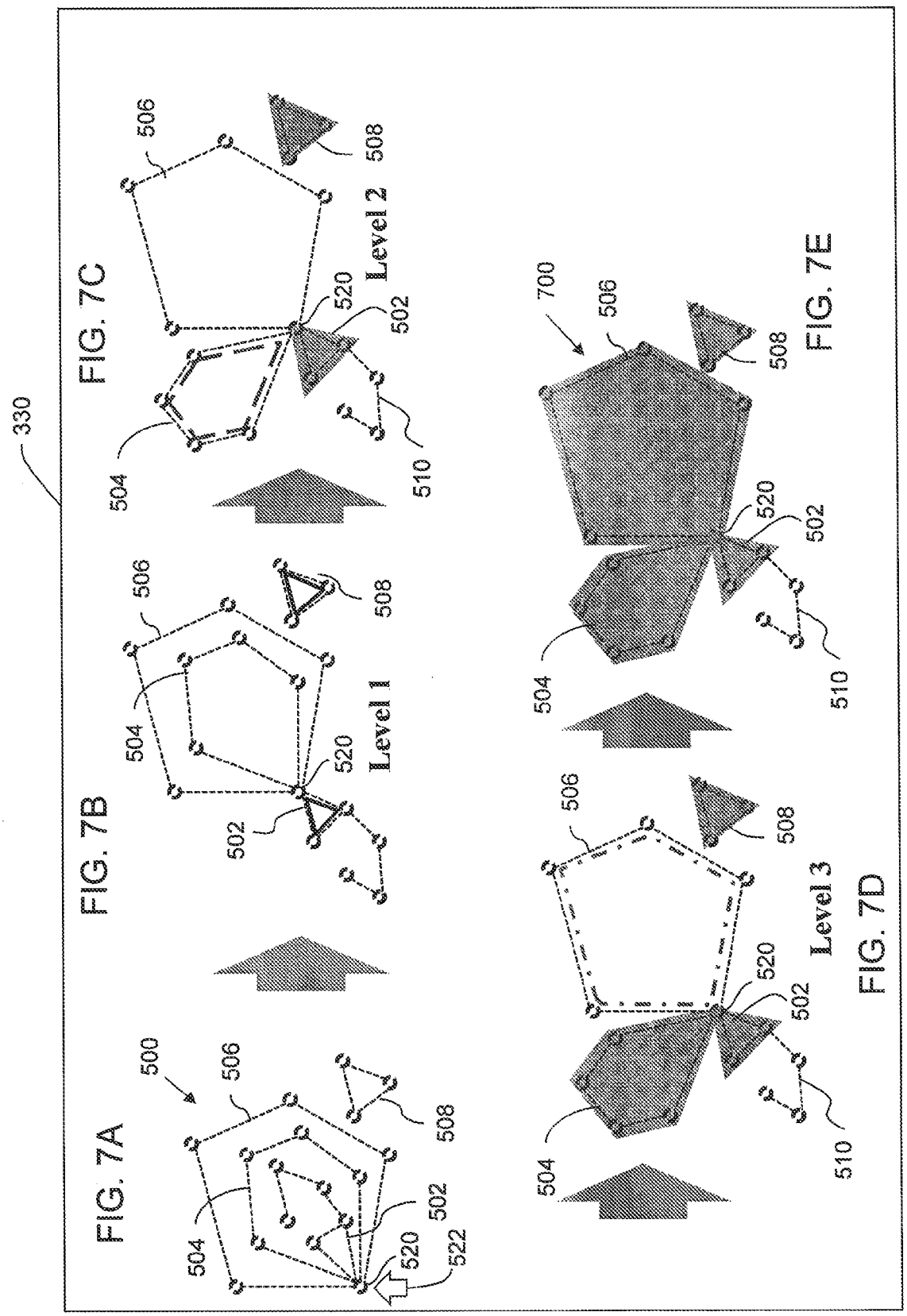

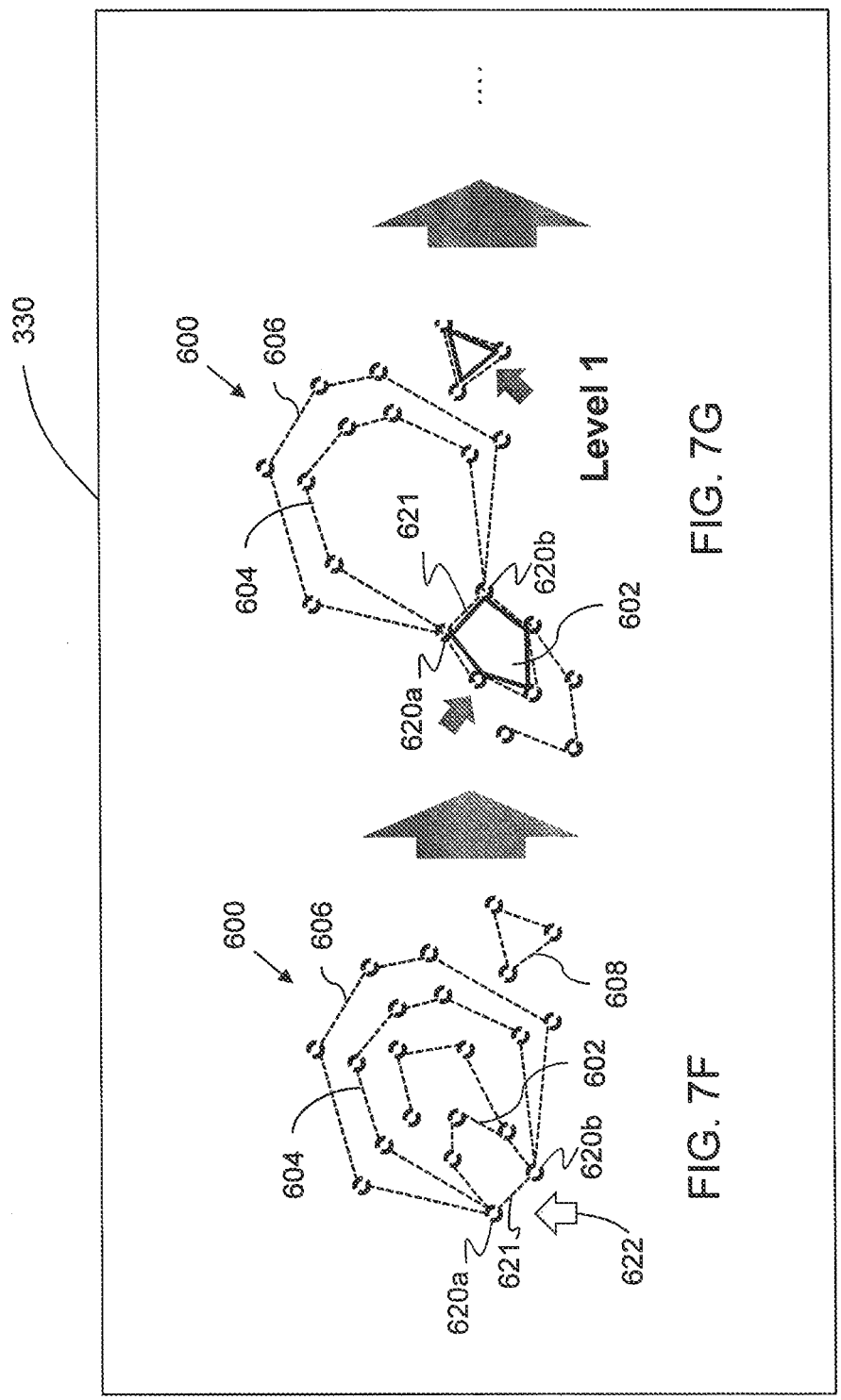

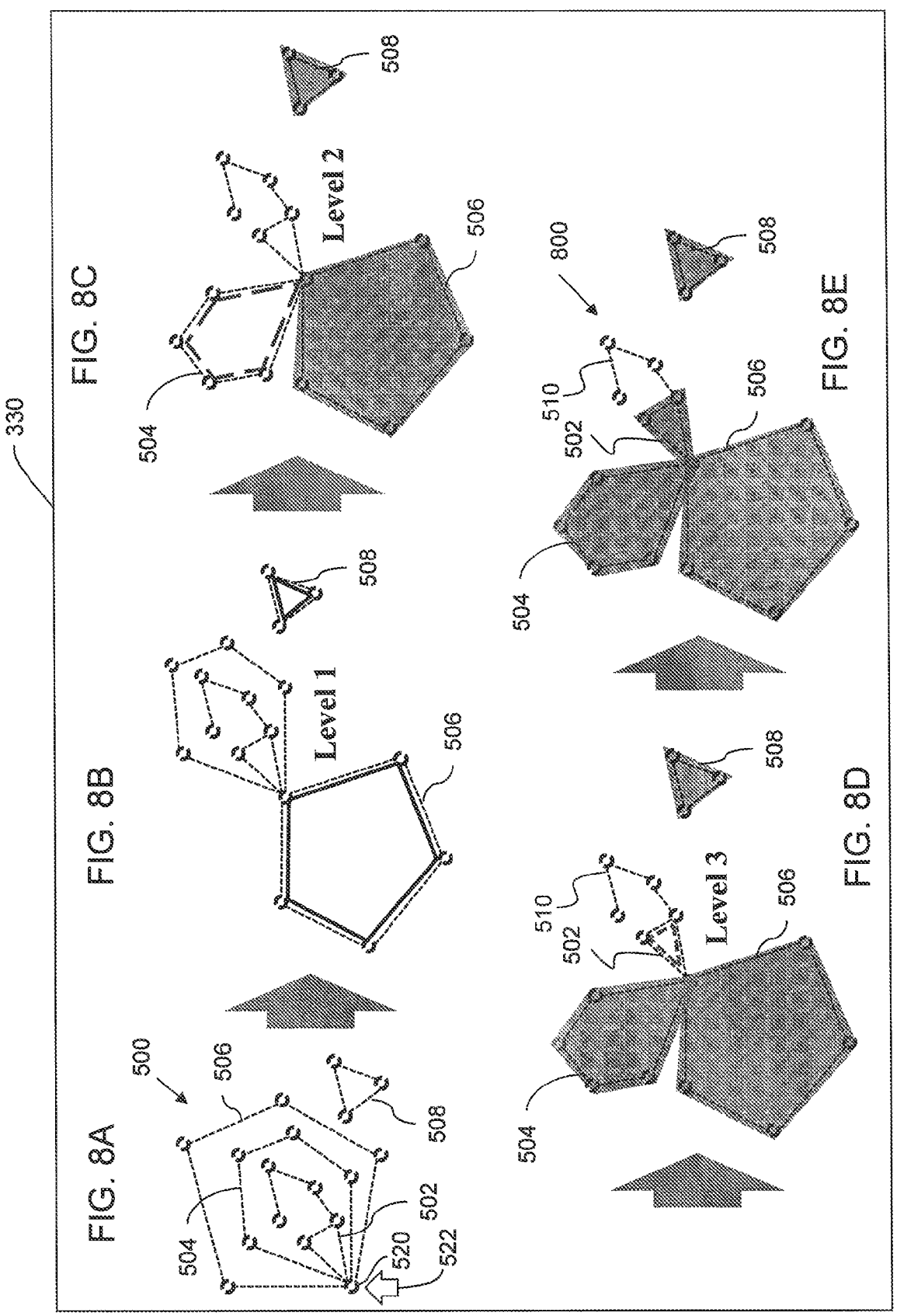

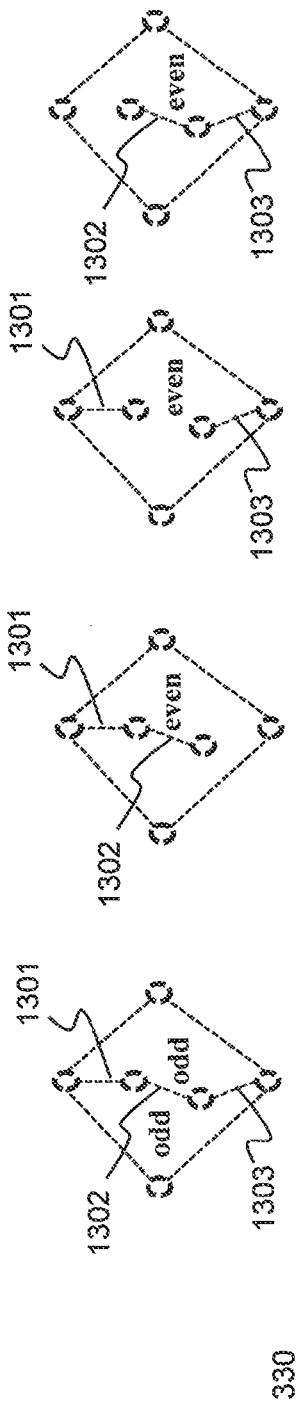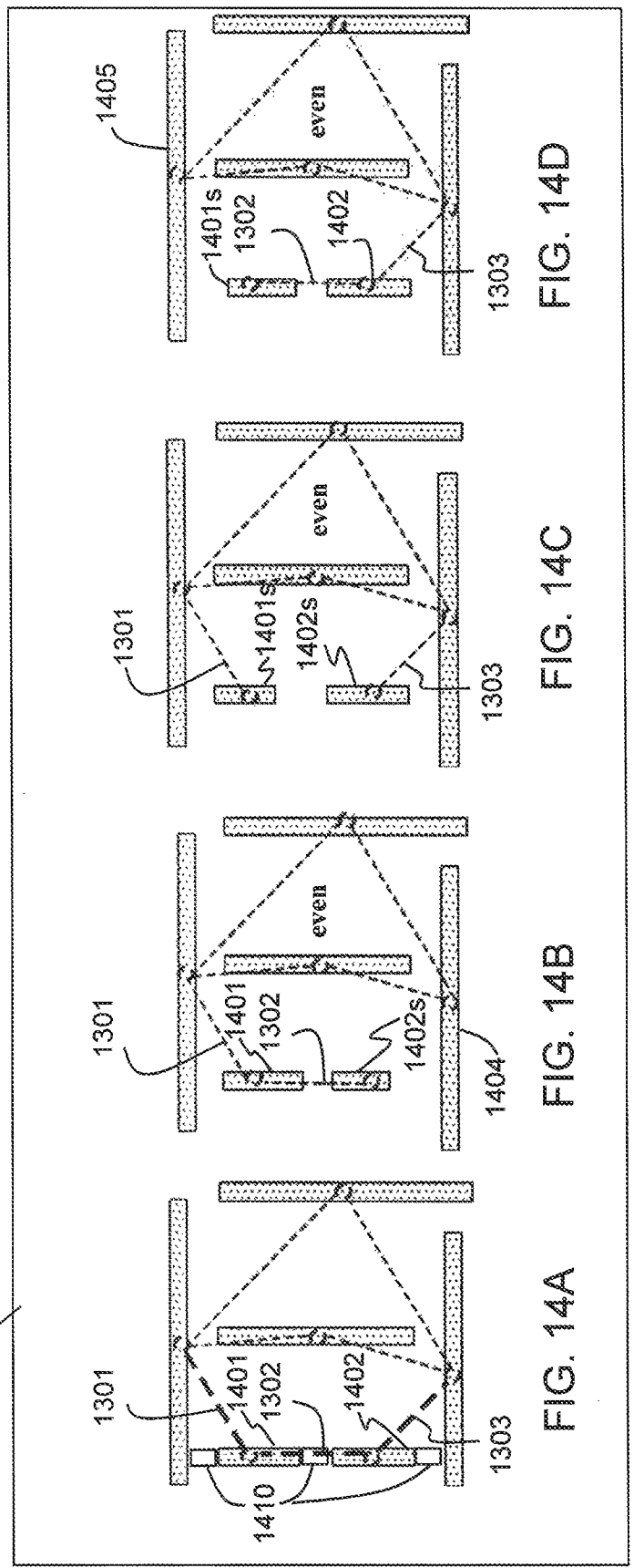

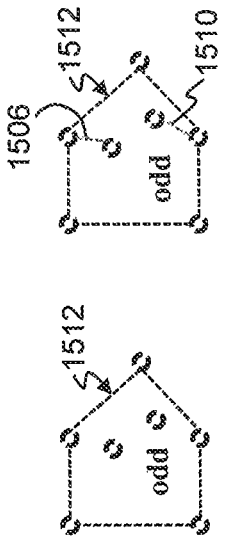
FIG. 15A
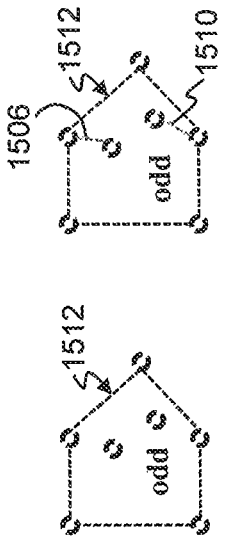
FIG. 15B
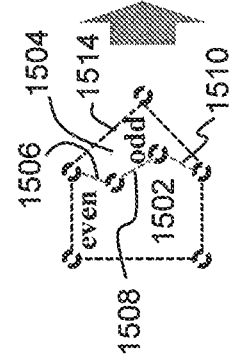
FIG. 15C
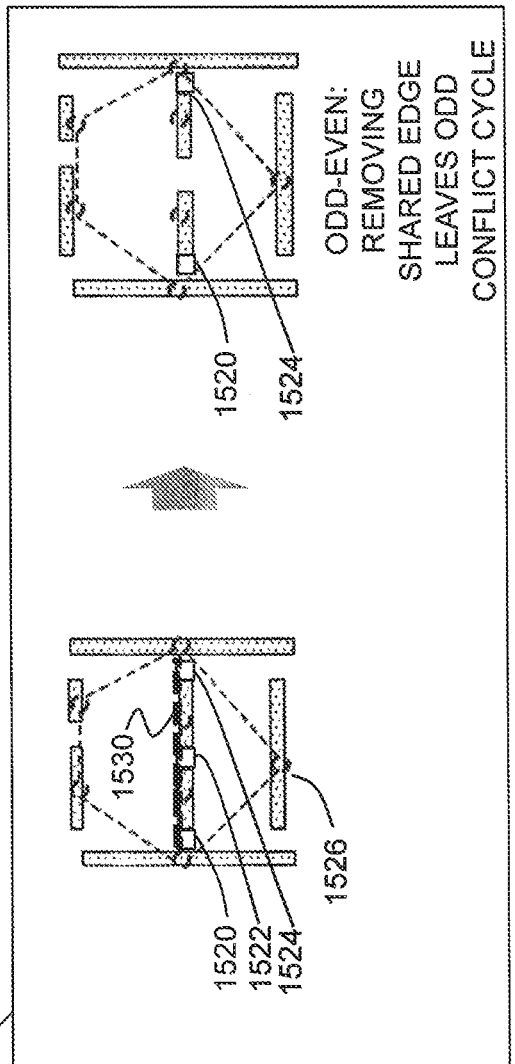
FIG. 15D
FIG. 15E

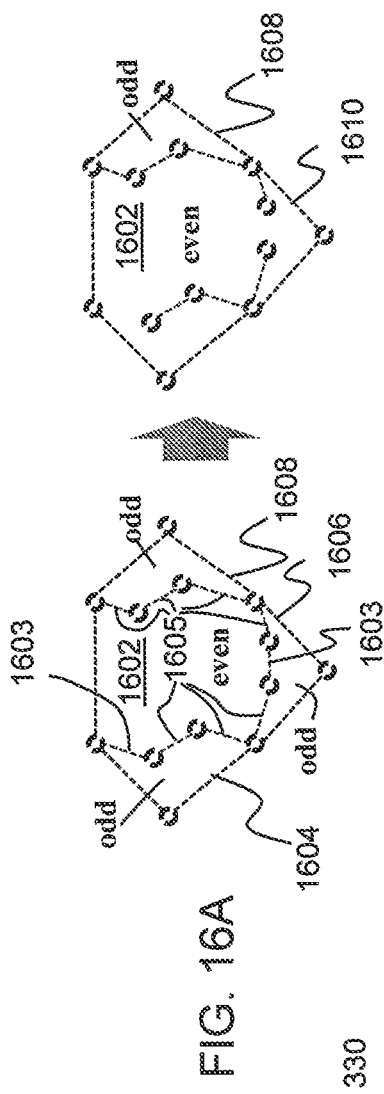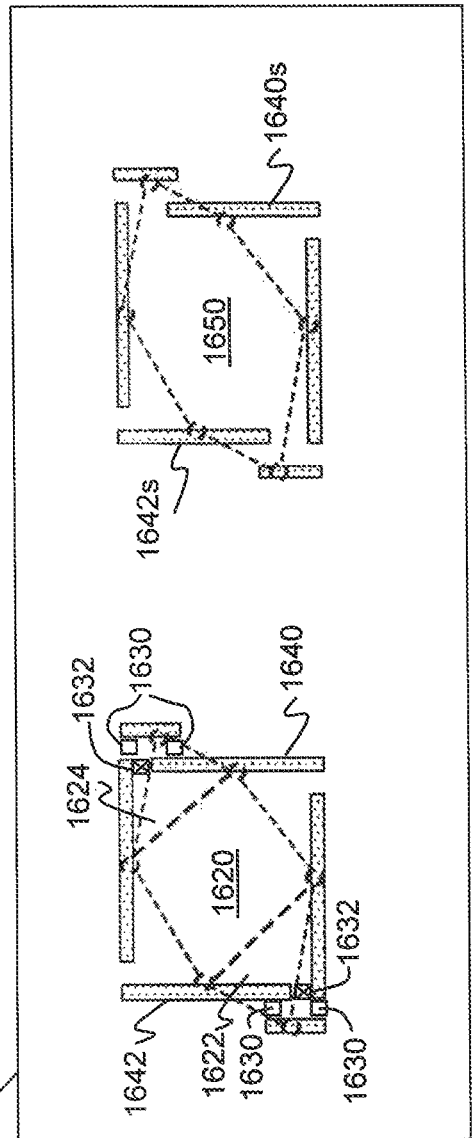
FIG. 16A
FIG. 16B
FIG. 16C
FIG. 16D

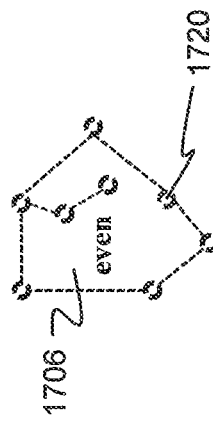
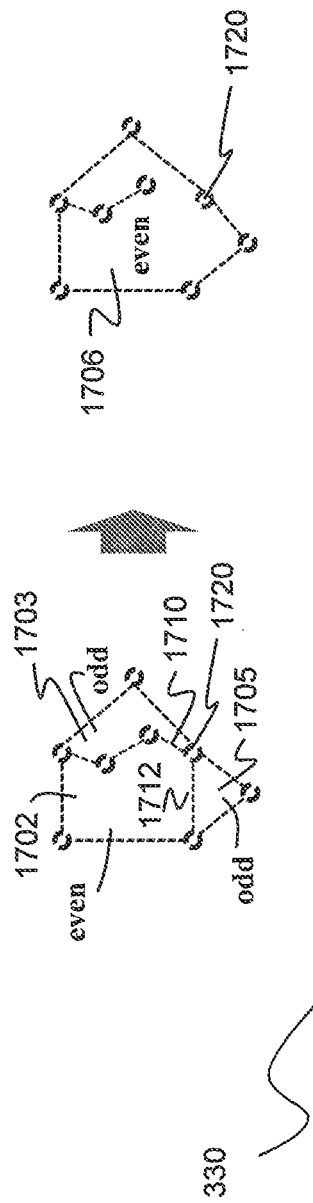
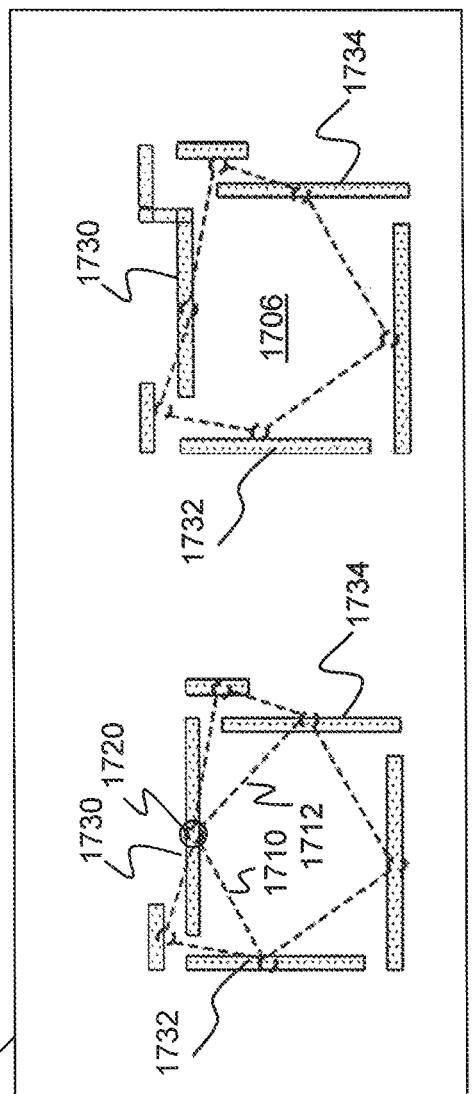
FIG. 17A
FIG. 17B
FIG. 17C
FIG. 17D

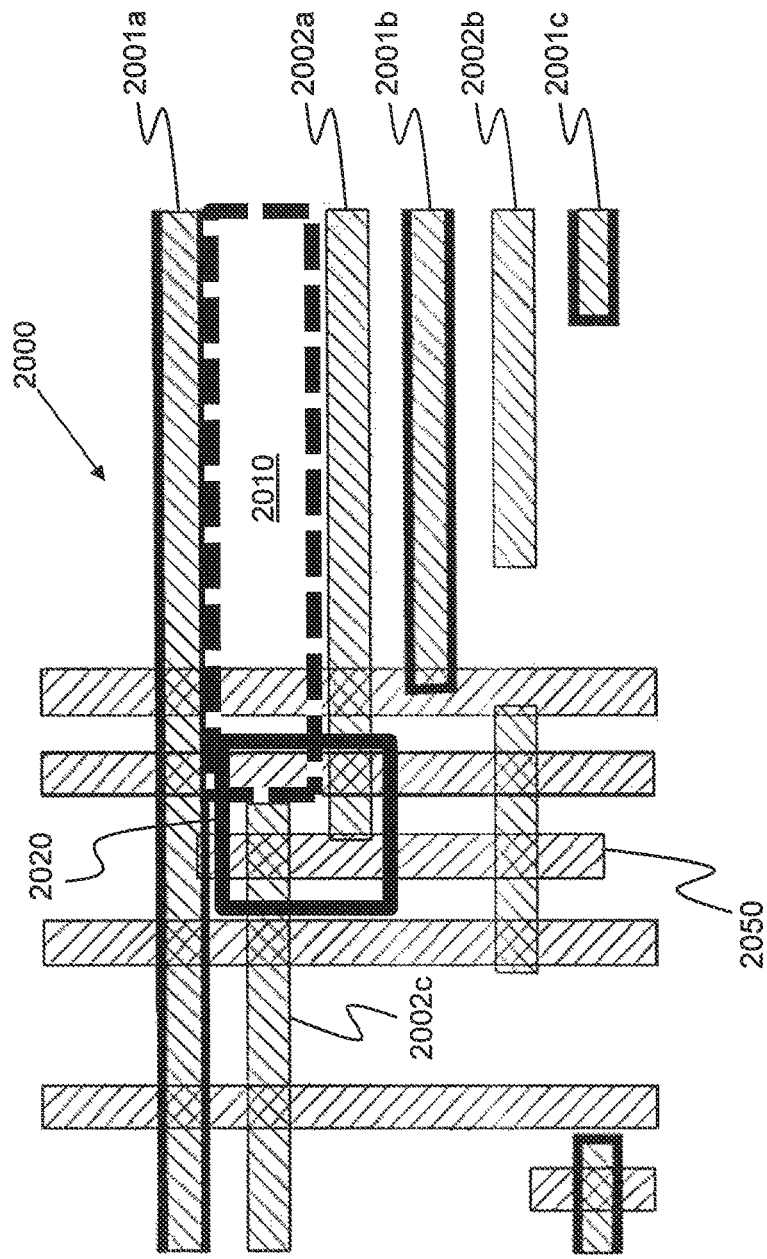

TOOL AND METHOD FOR ELIMINATING MULTI-PATTERNING CONFLICTS

FIELD

The present disclosure relates to electronic design automation tools used for semiconductor integrated circuit (IC) design and photomask layout generation.

BACKGROUND

In semiconductor fabrication processes, the resolution of a photoresist pattern begins to blur at about 45 nanometer (nm) half pitch. To continue to use fabrication equipment purchased for larger technology nodes, double exposure methods have been developed.

Multiple exposure or multi-patterning technology (MPT) involves forming patterns on a single layer of a substrate using two or more different masks in succession. If only two masks are used for patterning a layer, the technique is referred to as double exposure. One form of double exposure is referred to as double patterning technology (DPT). In DPT, first and second masks are used sequentially to pattern the same layer. As long as the patterns within each mask comply with the relevant minimum separation distances for the technology node, the combination of patterns formed using both masks may include smaller separations than the minimum separation distance. MPT allows line segments, and in some cases, vertices (angles) to be formed of a vertical segment and a horizontal segment on the same mask. Thus, MPT generally allows for greater reduction in overall IC layout.

MPT is a layout splitting method analogous to an M-coloring problem for layout splitting in graph theory, where M is the number of masks used to expose a single layer (and the number of exposures). For example, if two masks are to be used (double patterning, DPT), it is customary to refer to the patterns as being assigned one of two "color types", where the color corresponds to a photomask assignment.

If a given pattern in a given layer cannot be assigned to a different mask from every adjacent pattern in the same layer that is closer than the minimum separation distance, a conflict cycle is present. Resolution of the conflict cycle without increasing the number of masks involves insertion of a stitch or a change to the layout.

BRIEF DESCRIPTION OF THE DRAWINGS

FIGS. 1A, 1C, 1E and 1G show examples of IC layouts with conflict cycles.

FIGS. 1B, 1D, 1F and 1H show conflict cycle graphs representing the IC layouts of FIGS. 1A, 1C, 1E and 1G, respectively.

FIG. 3 is a block diagram of an automated, computer implemented tool for displaying and suggesting resolution of MPT conflict cycles.

FIGS. 5A-5G show a display representing a sequenced decomposition of the layout into conflict cycles of different levels, for identifying an inner-to-outer sequence of resolving the conflict cycles.

FIGS. 6A-6G show a display representing a sequenced decomposition of the layout into conflict cycles of different levels, for identifying an outer-to-inner sequence of resolving the conflict cycles.

FIGS. 7A-7E show a display representing a sequenced decomposition by folding of the layout into conflict cycles of different levels, for identifying an inner-to-outer sequence of resolving the conflict cycles.

FIGS. 7F and 7G show a display representing a sequenced decomposition by folding of the layout into conflict cycles of different levels, in which two nodes are shared by plural conflict cycles.

FIGS. 8A-8E show a display representing a sequenced decomposition by folding of the layout into conflict cycles of different levels, for identifying an outer-to-inner sequence of resolving the conflict cycles.

FIGS. 13A-14D show a display warning that removing the edge between abutting odd and even loops would leave an odd conflict cycle.

FIGS. 15A-15E show a display suggesting a resolution of abutting odd-loop and even loop cycles.

FIGS. 16A-16D show a display suggesting a resolution of plural odd-loop cycles abutting the same even loop.

FIGS. 17A-17D show a display suggesting a resolution of plural odd-loop cycles abutting the same even loop, if the odd loops have a common vertex.

FIGS. 20A and 20B show another display that is rendered to assist the user in identifying resolution of a conflict using layout format.

DETAILED DESCRIPTION

Figure 1A:
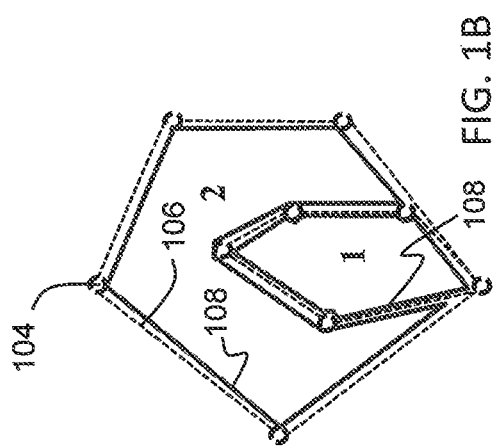

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

The inventors have developed a computer implemented system and method to classify all MPT coloring conflict cycles and provide an intelligent and user friendly interface for highlighting them for designers or other automated tools to effectively resolve MPT conflicts in IC layouts.

FIGS. 1A-1H show examples of IC patterns and graphs representing those patterns. FIGS. 1A, 1C, 1E and 1G each show a portion of a layout, including a plurality of circuit patterns, and FIGS. 1B, 1D, 1E and 1H are corresponding graphs which simplify identification of resolution to MPT conflict cycle issues.

As shown in FIGS. 1A, 1C, 1E and 1G, each pattern 102 (or polygon) of the IC layout is represented in the corresponding graphs 1B, 1D, 1E and 1H by a vertex 104 located at the center of the polygon 102. For any given technology node, a minimum separation distance (G0) is the minimum distance between two polygons 102 in order for them to be patterned clearly on the same layer using a single mask with a single exposure. In FIGS. 1A, 1C, 1E and 1G, any pair of adjacent polygons 102 which are separated by a space less than the minimum separation distance is represented by an edge 106 in the respective graphs 1B, 1D, 1E and 1H. Any sequence of three or more vertices 104 connected by edges 106, which begins and ends with the same vertex 104 is a cycle. In many cases, MPT permits all of the IC patterns (polygons) 102 represented by a cycle to be clearly patterned in the same layer using plural photomasks (even though the same patterns could not all be patterned clearly by a single mask). Given a number of masks M, if the number of IC patterns 102 represented by a cycle is such that those patterns cannot be clearly patterned in the same layer using M photomasks, a conflict cycle is present. In 1B, 1D, 1E and 1H, conflict cycles 108 are shown by the solid lines connecting vertices 104. A single graph may have more than one conflict cycle 108.

For example, in the case where M=2 (DPT), a cycle having an even number of edges 106 (referred to as an even-loop cycle) can be patterned clearly with two masks. However, if M=2, a cycle having an odd number of edges 106 (referred to as an odd-loop cycle) cannot be patterned clearly with two masks. For DPT, an odd-loop cycle is an MPT conflict cycle, resolution of which involves a change to at least one of the patterns.

In the discussion below, reference is frequently made to vertices 104 and edges 106. One of ordinary skill understands that this is for brevity and ease of understanding. Nevertheless, each reference to a polygon 102 or a vertex 104 is a reference to a pattern to be formed in a photomask for use in a semiconductor IC fabrication process; and each reference to an edge 106 represents a pair of polygon patterns 102 of an IC layout which are too close to each other to be patterned on the same layer using a single mask with a single exposure. Thus, the graphs and the vertices represent tangible IC circuit patterns formed in a semiconductor device.

Further, in discussing resolution of conflict cycles, any reference to removing an edge 106 from the graph represents changing the distance between two polygons, e.g., by moving one or both polygons, by changing a length of one or both polygons, changing a shape of one or both polygons, or by rerouting one or both polygons, or the like. Similarly, any reference to splitting a vertex into two vertices represents inserting a stitch in a polygon, so that a first portion (e.g., about half) of the polygon can be formed in a first mask and the remainder of the polygon can be formed in a second mask. To assist in the recognition of this representation, the graphs of FIGS. 1B, 1D, 1E and 1H are shown superimposed on the respective layouts of FIGS. 1A, 1C, 1E and 1G. In these examples, the length of the edges equals the center-to-center distance between polygons. However, for purpose of MPT conflict cycle resolution, the graphs can be drawn with non-proportional edges.

Using the graph terminology, a conflict cycle 108 is present if a vertex 104 of a loop (cycle) in a conflict graph cannot be assigned to a different mask from its adjacent vertices. As another example, if two photomasks are being used to pattern the layer (double patterning, DPT), and a cycle contains an odd number of vertices 104, it is a DPT conflict cycle. Although there is no simple mathematical expression defining all multi-patterning conflicts for cases where the number of photomasks M is greater than two, two MPT conflict cycle examples are in FIGS. 2A-2D (complete graphs of M+1 vertices), or FIGS. 2E-2J (an odd-length cycle, plus M−2 vertices connecting to all other vertices).

Figure 2D:
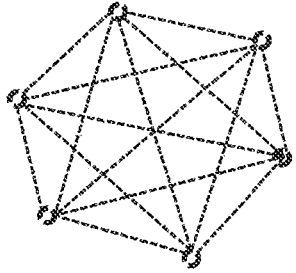
FIGS. 2A-2D show complete conflict cycle graphs for MPT methods including 2, 3, 4, and 5 photomasks, respectively.
Figure 2C:
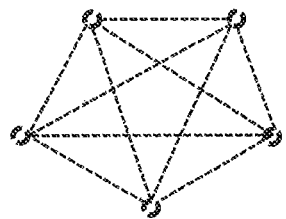
Figure 2B:
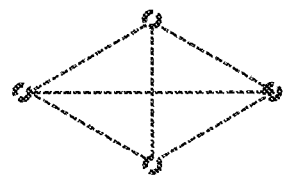
Figure 2A:
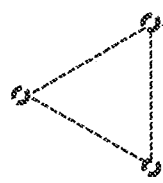

FIGS. 2A-2I show other examples of MPT conflict cycles, which are not limited to DPT. FIG. 2A is a graph of a DPT conflict cycle. FIGS. 2B, 2C and 2D show complete graphs of conflict cycles for MPT using 3, 4 and 5 masks, respectively. In FIGS. 2B-2D, the lines connecting non-adjacent vertices along the perimeter indicate that even though the polygons represented by those vertices are not immediately adjacent, they are still too close to each other to be patterned clearly in a single exposure using a single mask. If M>2, a complete graph having M+1 vertices, there is a conflict cycle.

Figure 2J:
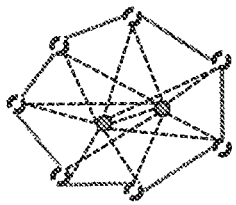
FIGS. 2H-2J show odd-length cycles with M−2 vertices (M=number of masks) connecting to all other vertices, where M=4
Figure 2I:
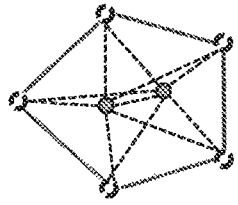
Figure 2H:
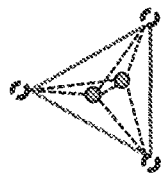
Figure 2G:
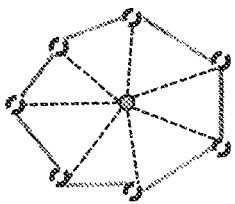
FIGS. 2E-2G show odd-length cycles with M−2 vertices (M=number of masks) connecting to all other vertices, where M=3.
Figure 2F:
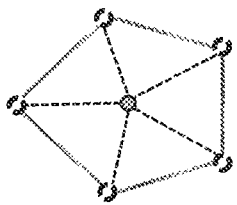
Figure 2E:
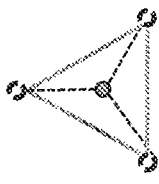

Another case of conflict cycle of M>2 is defined as an odd-length cycle having M−2 vertices connected to all other vertices. FIGS. 2E-2G show graphs of layout configurations for triple patterning (M=3), which have conflict cycles, even though they are not complete graphs. (This is, any given vertex is connected to some, but not all of the remaining vertices in the graph). Similarly, FIGS. 2H-2J show graphs of layout configurations for quadruple patterning (M=4), which have conflict cycles, even though they are not complete graphs.

Figure 1B:
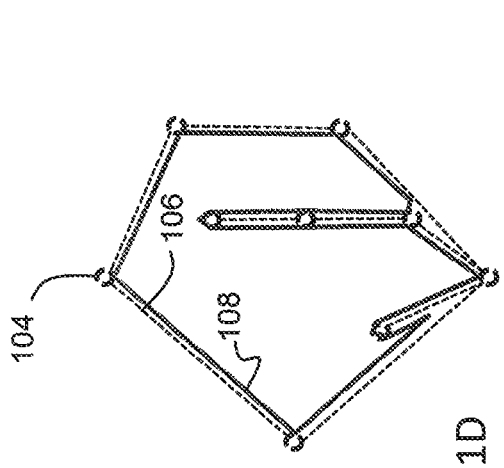
Figure 1C:
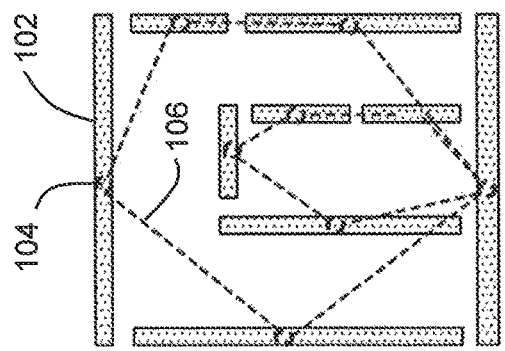
Figure 1D:
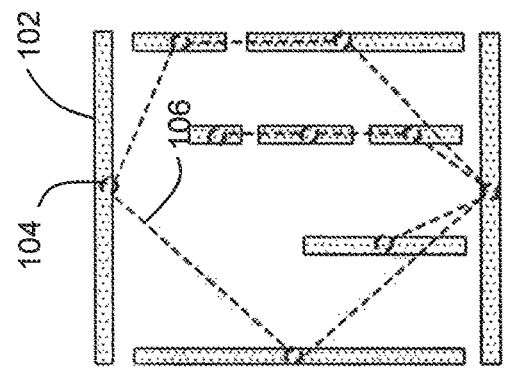

Referring again to FIGS. 1A, 1C, 1E and 1G, each of these layout portions includes a hierarchical conflict cycle. In FIGS. 1B, and 1F, each graph includes an odd loop conflict cycle 108 that is fully enclosed within another odd loop cycle. The layout (FIGS. 1A, 1E) does not inherently tell the designer which changes to make to most quickly resolve all of the conflict cycles. FIG. 1C shows several vertices 104 and edges 106 enclosed within an odd loop cycle 108. Such configurations present difficulty for the designer to resolve, because a layout change that resolves one odd loop cycle may introduce another odd loop cycle. FIG. 1G shows an even loop cycle enclosed by an odd loop cycle. Although the even loop cycle does not, by itself, create a DPT conflict cycle, the layout view does not guide the user to focus on the outer odd loop cycle. Further, the layout view does not steer the user away from resolving the odd loop cycle in a manner that introduces a new MPT conflict in the inner (even) loop.

FIG. 3 is a block diagram of a system 300 for multi-patterning conflict checking and resolution, according to one embodiment. Block 302 indicates that one or more programmed processors may be included. In some embodiments, the processing load is performed by two or more application programs, each operating on a separate processor. In other embodiments, the processes are all performed using one processor. Similarly, two media 306 and 308 are shown, but the data may be stored in any number of media. Although FIG. 3 shows an allocation of the various tasks to specific modules, this is only one example. The various tasks may be assigned to different modules to improve performance, or improve the ease of programming.

System 300 includes an electronic design automation ("FDA") tool 302 such as "IC COMPILER"™, sold by Synopsys, Inc. of Mountain View, Calif., which may include a place and route tool 304, such as "ZROUTE"™, also sold by Synopsys. Other EDA tools 302 may be used, such as the "VIRTUOSO" custom design platform or the Cadence "ENCOUNTER"®digital IC design platform may be used, along with the "VIRTUOSO" chip assembly router 304, all sold by Cadence Design Systems, Inc. of San Jose, Calif.

EDA tool 302 is a special purpose computer formed by retrieving stored program instructions from a non-transient computer readable storage medium 306, 308 and executing the instructions on a general purpose processor (not shown). Examples of non-transient computer readable storage mediums 306, 308 include, but are not limited to, hard disk drives (HDD), read only memories ("ROMs"), random access memories ("RAMs"), flash memories, or the like. Tangible, non-transient machine readable storage mediums 306, 308 are configured to store data generated by the place and route tool 304.

The router of the place and route tool 304 is capable of receiving an identification of a plurality of cells to be included in an integrated circuit ("IC") or interposer layout, including a netlist 320 containing pairs of cells within the plurality of cells to be connected to each other. Router 304 may be equipped with a set of default design rules 322 and tech file 324.

A module 310 performs the vertex/edge initial graph generation. This module receives the initial layout from the place and route tool. The module 310 calculates the relevant distances between adjacent patterns throughout the layout, and identifies each pair of patterns separated from each other by a spacing smaller than the (G0) minimum separation for a single mask. For each such pair having a separation less than G0, module 310 generates a vertex for each of the polygons, and an edge connecting the vertices. Module 310 constructs a preliminary graph, including all of the vertices and all of the edges. At this stage, the graph includes a plurality of vertices and edges, which may or may not create MPT conflicts. In some embodiments, module 310 displays this initial graph on display 330 immediately. Display 330 may be the display of a computer or another networking device, or a simple display screen.

In other embodiments, the initial graph information is immediately processed by the conflict cycle highlighting module 312. The conflict cycle highlighting module 312 receives the initial graph and the identification of M, the number of photomasks to be used to expose a single layer by MPT. Module 312 identifies all of the cycles in the initial layout, and analyzes the layout to identify all of the MPT conflict cycles in the initial layout. Module 312 ascertains a hierarchical sequence of the conflict cycles, and generates a graphical representation highlighting all of the conflict cycles and identifying a suggested sequence for revising one or more polygons in the layout to resolve the conflict cycles. The output display module 330 identifies any odd loops in the graph, and outputs the graph with a respective visual identification of each odd loop (i.e., each multi-patterning conflict.)

The warnings and suggested resolutions module 316 applies a set of conflict cycle suggestion rules and priorities 326 to automatically identify warnings for changes that should not be made and suggestions for changes that should be made to resolve the conflict cycles. Module 316 causes the display 330 to display any applicable warning, and to display the next suggested change to be made to resolve one or more of the conflict cycles. Thus, module 316 recognizes the prioritized sequence of suggested changes, and updates the next suggested action each time a change is made. In some embodiments, module 316 displays the highlighted graph from module 312, with an additional indicator suggesting the next conflict cycle to be resolved and the suggested resolution.

Module 316 is effective to suggest the next resolution to be implemented regardless of whether a hierarchy of nested conflict cycles is currently being displayed with the suggested sequence. Thus, in an alternative embodiment, module 316 shows the suggested conflict cycle to be resolved next without displaying the graph including all of the other conflict cycles and the suggested sequence for resolving the other conflict cycles.

Figure 4:
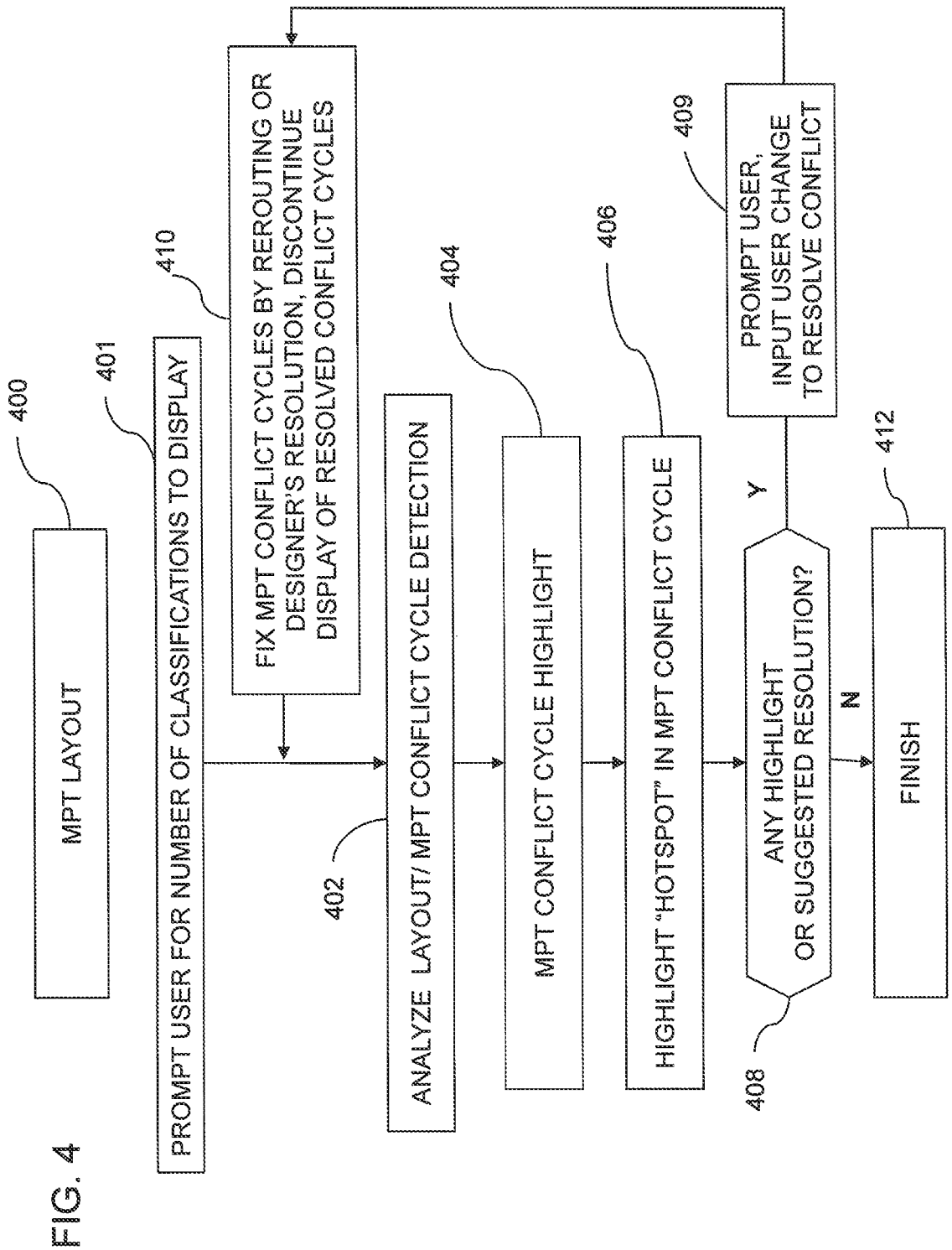
FIG. 4 is a flow chart of a method of displaying conflict cycles and suggested resolutions.

FIG. 4 is a flow chart of a computer implemented method.

At step 400, the place and route tool provides an initial layout having a plurality of polygons.

At step 401, in some embodiments, before the conflict cycles are displayed, the system prompts the user to input a number N of classifications to be displayed at any given time. Subsequently, the displaying will include initially displaying those multi-patterning conflict cycle graphs having the first N classifications.

At step 402, the processor analyzes the initial layout of an integrated circuit pattern layer having a plurality of polygons 102, so as to identify a plurality of multi-patterning cycles in the initial layout. This includes calculating the relevant distances between adjacent patterns 102 throughout the layout, and identifying each pair of patterns separated from each other by a spacing smaller than the (G0) minimum separation for a single mask. For each such pair having a separation less than G0, a vertex 104 is generated for each of the polygons 102, and an edge 106 connecting the vertices 104. Any sequence of vertices 104 connected by edges 106, which begins and ends with the same vertex defines a cycle. This initial determination includes both odd and even loop cycles. In other words, all cycles are initially identified, regardless of whether they currently create an MPT conflict cycle.

Then the relevant criterion is used to determine whether any of the cycles is an MPT conflict cycle. For example, in the case of DPT, all odd-loop cycles are identified as MPT conflict cycles.

At step 404, an MPT conflict cycle highlighting process is performed. The processor constructs a respective multi-patterning conflict cycle graph representing each identified multi-patterning conflict cycle. FIGS. 5A-8E show alternative formats and sequences for presenting the highlighted conflict cycle graphs, as discussed below.

At step 406, the system optionally displays a small region of the layout (as shown in FIGS. 19A to 20B), to simplify identification of actions to resolve the conflict cycles, as discussed below.

At step 408, the system automatically determines whether there are any more remaining conflict cycles to be highlighted, and for which the system will automatically generate a suggestion for resolving the conflict cycle. If more conflict cycles remain, steps 409, 410 and 402-408 are performed.

At step 409, the system prompts the user to input a change for resolving one of the multi-patterning conflict cycles currently being displayed. The user inputs a change to the layout to fix the next conflict cycle suggested by the system. The system receives the change input by the user.

At step 410, the system modifies the graph to fix the MPT conflict cycle by re-routing or by using the designer's input Then, the system repeats steps 402-408, taking into account all of the conflict cycles that are affected by the change to the layout. In some cases, the action suggested by the system and adopted by the designer's input resolves more than one conflict cycle at the same time. The system recognizes this and discontinues the display of the (now resolved) conflict cycle(s). If the user has specified a number N of levels of conflict cycles to be displayed, and all of the conflict cycles at the current level are resolved, then the next level (N+1) of conflict cycle is added to the display. Likewise, if a single layout change resolves two levels of conflict cycles, the next two levels of conflict cycles are added to the display. By constantly displaying the first N remaining levels of conflict cycles, the system ensures that the user is not overwhelmed with so much visual information that the nature of the conflicts to be resolved is obscured.

At step 412, when there are no more unresolved conflict cycles to be addressed at step 408, the task is finished.

FIGS. 5A-5G show a first representation of the conflict cycle identification and sequencing. This method initially displays all of the plurality of multi-patterning conflict cycle graphs in a combined graph; and then for each classification, successively separately displays each multi-patterning conflict cycle graph having that classification, one classification at a time. As each multi-patterning conflict cycle graph is separately displayed, that multi-patterning conflict cycle graph is deleted from the combined graph, while continuing to display a remainder of the combined graph.

In FIGS. 5A-5G, the process begins with the innermost conflict cycle 502, and continues in several stages, until all conflict cycles are separated from the most inner to the most outer conflict cycle. The innermost conflict cycle 502 is identified as the cycle represented by a cycle that is completely enclosed by another cycle, but does not contain any other cycle.

In FIG. 5A, initially, the entire portion of the IC layout is displayed. Each conflict cycle is represented by a closed polygon. The innermost conflict cycle 502 is inside a middle conflict cycle 504, which is inside an outer conflict cycle 506. Another conflict cycle 508 is neither inside nor outside of any other conflict cycle. One vertex 520 is shared by three conflict cycles 504, 506, 508. The conflict cycle highlighting module 312 (FIG. 3) recognizes that three nested conflict cycles share a common vertex 520, indicating that one IC pattern belongs in three different nested conflict cycles. An indicator 522 is displayed identifying vertex 520 as a candidate for stitching, as a suggested resolution of the three conflict cycles. The indicator 522 may be an arrow as shown, or any other indicia (e.g., text and/or other shape) may be used to point out the vertex for which stitching is recommended.

The conflict cycle processing classifies each identified multi-patterning conflict cycle graph in the computer according to a number of other multi-patterning conflict cycle graphs which enclose that multi-patterning conflict cycle graph. For example, a level 1 conflict cycle does not enclose any other conflict cycle. A level 2 conflict cycle encloses one or more level 1 conflict cycles. A level 3 conflict cycle encloses one or more level 2 conflict cycles, and so forth. (Where the classification is referred to as a level.)

In the example of FIGS. 5A-5G, the conflict cycle processing is performed in three stages. In each stage si, one or more conflict cycles enclosing no other conflict cycle are separated from the original conflict graph 500 and marked with level i.

FIGS. 5B and 5C show a first level of conflict cycle identification. The conflict cycles 502 and 508 do not enclose any other conflict cycles. These two conflict cycles 502 and 508 are separated out in a display area (FIG. 5C) separate from the remaining graphs (FIG. 5B). In some embodiments, the first level conflict cycles 502, 508 are displayed with their edges in a first color or pattern (shown by solid lines in FIG. 5C). The common vertex 520 is not removed from FIG. 5B, and remains in the graph 500 until all of the conflict cycles containing vertex 520 have been removed. Thus, in the first stage, the level one (inner) conflict cycles are moved to the separate region (FIG. 5C) of the display, and the levels two and three conflict cycles remain in the display region of FIG. 5B.

The procedure will continue until all conflict cycles are separated from the original conflict graph of FIG. 5A.

FIGS. 5D and 5E show a second level of conflict cycle identification. The conflict cycle 504 does not enclose any other conflict cycles, and is the innermost remaining conflict cycle. Note that the open graph 510 is not a complete cycle, and does not represent an MPT conflict The open graph 510 can be clearly patterned by M masks. Thus, conflict cycles 504 is separated out in a display area (FIG. 5E) separate from the remaining graphs (FIG. 5D). In some embodiments, the second level conflict cycle 504 is displayed with its edges in a second color or pattern (shown by dashed lines in FIG. 5E).

Thus, in the second stage, the level two (middle) conflict cycles are moved to the separate region (FIG. 5E) of the display, and the level three conflict cycles remain in the display region of FIG. 5D.

FIGS. 5F and 5G show a third level of conflict cycle identification. The conflict cycle 506 does not enclose any other conflict cycles, and is the innermost remaining conflict cycle. Thus, conflict cycles 506 is separated out in a display area (FIG. 5G) separate from the remaining graphs (FIG. 5F). In some embodiments, the third level conflict cycle 506 is displayed with its edges in a third color or pattern (shown by dash-dot lines in FIG. 5G). Although this example only has three nested levels of conflict cycles, any number of hierarchical conflict cycles can be decomposed in the same fashion.

At this stage, the only remaining graph 510 is not a complete cycle, and can be clearly patterned by M masks. The tool causes the display device to graphically display the plurality of multi-patterning conflict cycle graphs according to their respective classifications (levels).

Thus, in the third stage, the level three (outer) conflict cycles are moved to the separate region (FIG. 5G) of the display, and the open loops remain in the display region of FIG. 5F.

In some embodiments, the entire sequence of FIGS. 5A-5G is displayed simultaneously on the display 330, as shown. In other embodiments, FIG. 5A is shown first, then FIGS. 5B and 5C together, then FIGS. 5D and 5E added together, then FIGS. 5F and 5G are added together. In some embodiments, once displayed, each graph remains on the display 330 as additional figures are added.

Figure 5H:
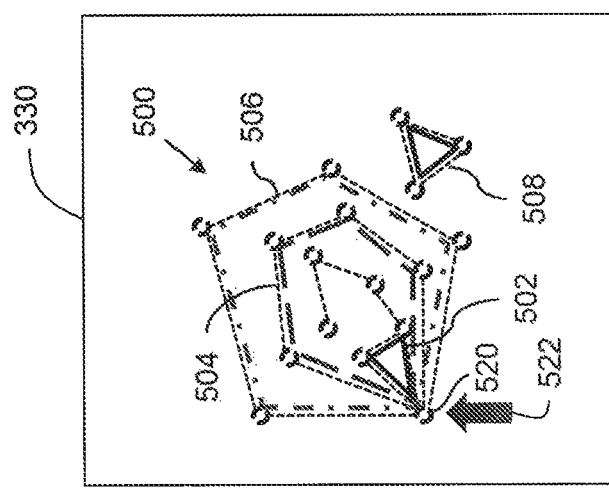
FIG. 5H is an optional additional display summarizing the components displayed in FIGS. 5A-5G.

In some embodiments, after displaying FIGS. 5A-5G, a graph in the format of FIG. 5H is displayed on display 330. FIG. 5H shows all of the conflict cycles included in the original graph of FIG. 5A, with the various colors or patterns displayed to indicate in which level each conflict cycle is included. Each of the multi-patterning conflict cycle graphs having each respective classification in a respectively different color, dash or dot style.

The system thus guides the user to resolve the conflicts in the following sequence, based on FIGS. 5C, 5E and 5G (or based on FIG. 5H). The user should first resolve conflict cycle 502 by replacing the vertex 520 with two vertices (corresponding to inserting a stitch in the layout, to divide the circuit pattern represented by vertex 520 into two parts, each to be formed on a separate mask). Then conflict cycle 508 should be resolved. If there is a remaining conflict cycle in level 2, that conflict cycle is resolved next. Finally, if there is a remaining conflict cycle in level 3, that conflict cycle is resolved last. In the simple example of FIGS. 5A-5H, proper insertion of the stitch (replacing vertex 520 by two vertices and an included edge, the conflict cycles 504 and 506 are also resolved. In more complex examples, additional changes to the layout are implemented for the level 2 and/or level 3 conflict cycles.

The method of FIGS. 5A-5G proceeds from the inside outward. FIGS. 6A-6G show an alternative variation, in which the system guides the user to proceed in resolving the conflict cycles from the outside in.

FIGS. 6A-6G show a second representation of the conflict cycle identification and sequencing. In FIGS. 6A-6G, the process begins with the outermost conflict cycle, and continues inward in plural stages, until all conflict cycles are separated from the most outer to the most inner. The outermost conflict cycle is identified as the cycle that completely encloses the most levels of other cycles, but is not contained by any other cycle.

In FIG. 6A, initially, the entire portion of the IC layout is displayed. This is the same as shown in FIG. 5A. A description is not repeated.

The conflict cycle processing classifies each identified multi-patterning conflict cycle graph in the computer according to a number of other levels of multi-patterning conflict cycle graphs enclosed by that multi-patterning conflict cycle graph. For example, a level 1 conflict cycle is not enclosed by any other conflict cycle. A level 2 conflict cycle is enclosed by one or more level 1 conflict cycles. A level 3 conflict cycle is enclosed by one or more level 2 conflict cycle, and so forth.

FIGS. 6B and 6C show a first level of conflict cycle identification. The conflict cycles 506 and 508 are not enclosed by any other conflict cycles. These two conflict cycles 506 and 508 are separated out in a display area (FIG. 6C) separate from the remaining graphs (FIG. 6B). In some embodiments, the first level conflict cycles 506, 508 are displayed with their edges in a first color or pattern (shown by solid lines in FIG. 6C). The common vertex 520 is not removed from FIG. 6B, and remains in the graph 500 until all of the conflict cycles containing vertex 520 have been removed.

The procedure will continue until all conflict cycles are separated from original conflict graph.

FIGS. 6D and 6E show a second level of conflict cycle identification. The conflict cycle 504 is not enclosed by any other conflict cycles, and is the outermost remaining conflict cycle. Thus, conflict cycles 504 is separated out in a display area (FIG. 6E) separate from the remaining graphs (FIG. 6D). In some embodiments, the second level conflict cycle 504 is displayed with its edges in a second color or pattern (shown by dashed lines in FIG. 6E).

FIGS. 6F and 76G show a third level of conflict cycle identification. The conflict cycle 502 does not enclose any other conflict cycles, and is the outermost remaining conflict cycle. Thus, conflict cycles 502 is separated out in a display area (FIG. 6G) separate from the remaining graphs (FIG. 6F). In some embodiments, the third level conflict cycle 502 is displayed with its edges in a third color or pattern (shown by dotted lines in FIG. 6G). Although this example only has three nested levels of conflict cycles, any number of hierarchical conflict cycles can be decomposed in the same fashion.

The displaying of FIGS. 6A-6G can be performed in the same ways described above for FIGS. 5A-5G. A description is not repeated. Optionally, after displaying FIGS. 6A-6G, a graph in the format of FIG. 6H is displayed. FIG. 6H shows all of the conflict cycles included in the original graph of FIG. 6A, with the various colors or patterns displayed to indicate which level each conflict cycle is included in.

Figure 6H:
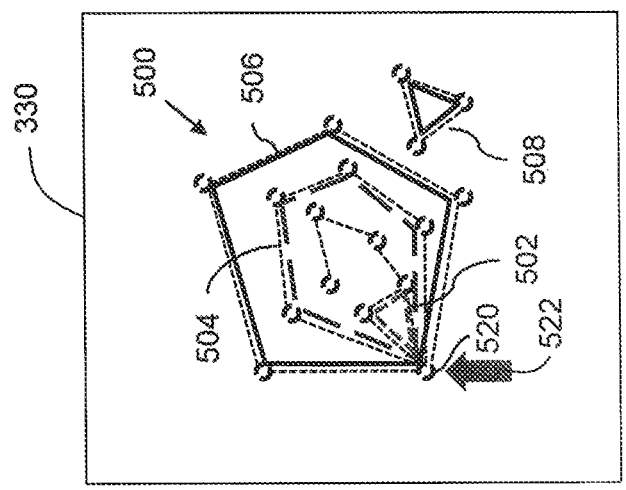
FIG. 6H is an optional additional display summarizing the components displayed in FIGS. 6A-6G.

The system thus guides the user to resolve the conflicts in the following sequence, based on the FIGS. 6C, 6E and 6G (or based on FIG. 6H). The user should first resolve conflict cycle 506 by replacing the vertex 520 with two vertices (corresponding to inserting a stitch in the layout, to divide the circuit pattern represented by vertex 520 into two parts, each to be formed on a separate mask). Then conflict cycle 508 should be resolved. If there is a remaining conflict cycle in level 2, that conflict cycle is resolved next. Finally, if there is a remaining conflict cycle in level 3, that conflict cycle is resolved last. In the simple example of FIGS. 6A-6H, proper insertion of the stitch (replacing vertex 520 by two vertices and an included edge, the conflict cycles 504 and 502 are also resolved. In more complex examples, additional changes to the layout are implemented for the level 2 and level 3 conflict cycles.

FIGS. 7A-7E and 8A-8E show an alternate graphical format for presenting similar information to the user. This method includes, if one of the vertices is shared by at least two of the multi-patterning conflict cycle graphs, for each multi-patterning conflict cycle graph having the shared vertex, successively folding out the multi-patterning conflict cycle graphs having the shared vertex, one classification at a time, until none of the multi-patterning conflict cycle graphs having the shared vertex is displayed within any other multi-patterning conflict cycle graph.

FIG. 7A shows the same set of hierarchical conflict cycle graphs as FIGS. 5A and 6A. In FIGS. 7B-7D, the conflict cycles are highlighted beginning with the innermost conflict cycles 502 and 508, and continuing to the outermost conflict cycle 506. As each conflict cycle is highlighted, it is folded or rotated about the common vertex 520. In FIG. 7B, conflict cycle 502 is folded around vertex 520. The other first level conflict cycle 508 is also highlighted. Further, the level, "Level 1" is displayed.

In FIG. 7C, in the second stage of processing, the conflict cycle 504 is highlighted and folded about vertex 520, and the previously processed conflict cycles 502 and 508 are indicated by an indicia, such as gray fill, or other indication. Further, the level, "Level 2" is displayed.

In FIG. 7D, in the third stage of processing, the conflict cycle 506 is highlighted. If there are any remaining higher level conflict cycles, then cycle 506 is folded about vertex 520, and the previously processed conflict cycles 502, 504 and 508 are indicated by an indicia, such as gray fill, or other indication. The level, "Level 3" is displayed. If there are no remaining levels, then conflict cycle 506 need not be folded; all of the conflict cycles are now unfolded about the common vertex, and displayed with the indicia. The common vertex 520 is identified as a candidate for replacement by two vertices (corresponding to inserting a stich in one of the patterns of the IC).

In some embodiments, the folding is performed so that that the final arrangement of the folded conflict cycle graphs 502, 504, 506 shows them arranged sequentially from innermost to outermost in clockwise order. In reviewing the final graph of FIG. 7E, the designer can also identify directly from the relative sizes of the conflict cycles 502, 504, 506 the order of the levels.

As in FIGS. 5A-5G, in some embodiments, all of the FIGS. 7A to 7E are displayed simultaneously, to graphically inform the user of the level of each conflict cycle, guiding the user in selecting the order in which to resolve the conflict cycles. In other embodiments, FIGS. 7A to 7E are displayed sequentially. In some embodiments, as each of FIGS. 7A to 7E is sequentially added, the previous FIGS. 7A-7D remain on the display. FIGS. 7A to 7E provide a different format for guiding the user to resolve the conflicts in the same order as FIGS. 5A to 5G.

FIGS. 7F and 7G show a display representing a sequenced decomposition by folding of the layout into conflict cycles of different levels, in which two nodes are shared by plural conflict cycles. The graph 600 includes three nested conflict cycles 602, 604, 606, and another non-nested conflict cycle 608. The nested conflict cycles all share two vertices 620a, 620b and an edge 621 connecting the shared vertices. The method is the same as described above with reference to FIGS. 7A-7E. The folding is performed to successively fold each of the nested conflict cycles about the edge 621 connecting the two shared vertices 620a, 620b. FIG. 7G shows the graph as it is displayed after folding the innermost conflict cycle 602.

FIGS. 8A to 8E use the sequence proceeding from the outermost conflict cycle to the innermost conflict cycle, similar to FIGS. 6A to 6G, and also use the folding format of FIGS. 7A to 7E.

FIG. 8A shows the same set of hierarchical conflict cycle graphs as FIGS. 5A and 6A. In FIGS. 8B-8D, the conflict cycles are highlighted beginning with the outermost conflict cycles 506 and 508, and continuing to the innermost conflict cycle 502. As each conflict cycle is highlighted, it is folded or rotated about the common vertex 520. In FIG. 8B, conflict cycle 506 is folded around vertex 520. The other first level conflict cycle 508 is also highlighted. Further, the level, "Level 1" is displayed.

In FIG. 8C, in the second stage of processing, the conflict cycle 504 is highlighted and folded about vertex 520, and the previously processed conflict cycles 506 and 508 are indicated by an indicia, such as gray fill. Further, the level, "Level 2" is displayed.

In FIG. 8D, in the third stage of processing, the conflict cycle 502 is highlighted. If there are any remaining higher level conflict cycles, then cycle 502 is folded about vertex 520, and the previously processed conflict cycles 504, 506 and 508 are indicated by an indicia, such as gray fill, or other indication. The level, "Level 3" is displayed. If there are no remaining levels, then conflict cycle 502 need not be folded; all of the conflict cycles are now unfolded about the common vertex, and displayed with the indicia. The common vertex 520 is identified as a candidate for replacement by two vertices (corresponding to inserting a stich in one of the patterns of the IC).

In some embodiments, the folding is performed so that the final arrangement of the folded conflict cycle graphs 502, 504, 506 shows them arranged sequentially from outermost to innermost in clockwise order.

In more complex layouts, there may be two or more shared vertices within a group of hierarchical conflict cycles. The system prioritizes by suggesting that the user first resolve the group having the vertex shared by the most conflict cycles. So, for example, if vertex one is involved in three conflict cycles and vertex two is only involved in two conflict cycles, vertex one will have a higher priority in the system. The system will recommend that the designer resolve vertex one first.

Figure 9:
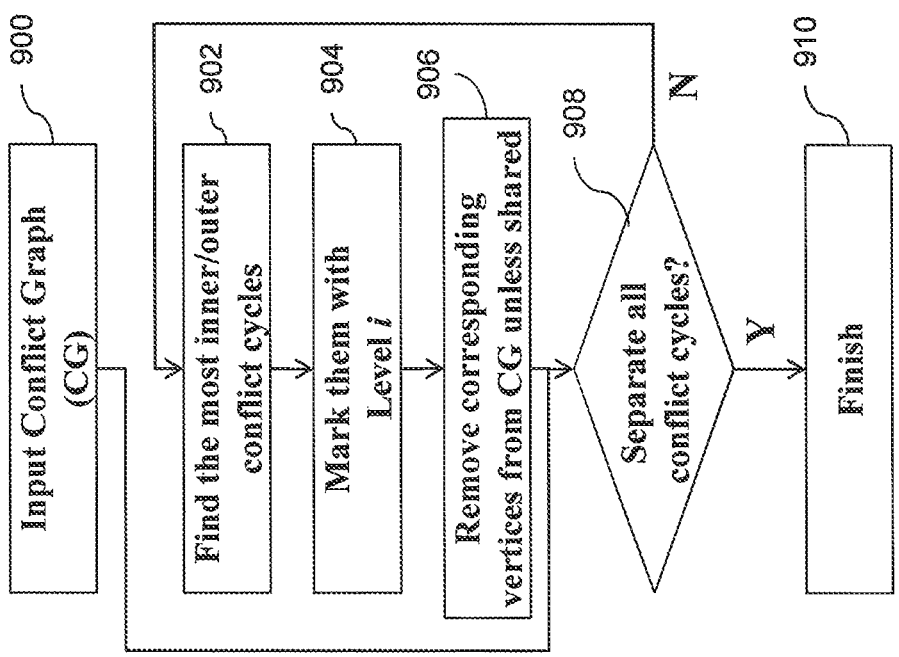
FIG. 9 is a flow chart for a method of forming the displays of FIGS. 5A-6H.

FIG. 9 is a high-level flow chart of a method for providing automated suggestions for resolving the conflict cycles, as shown in FIGS. 5A to 6H.

At step 900, the conflict graph information is input. This may include inputting a previously stored set of conflict cycle graphs (e.g., as shown in FIG. 5A), or processing the initial layout information from the EDA tool, to generate the conflict graphs anew. Step 900 is performed once. Then control is passed to step 908 for the main loop.

At step 902, either the innermost remaining level (classification) of conflict cycle is found (FIG. 5B) for inner-to-outer processing, or the outermost conflict cycle is determined (FIG. 6B) for outer-to-inner processing.

At step 904, the level i determined at step 902 is marked with an indicia of "Level i" and displayed on display 330.

At step 906, the corresponding vertices and edges are removed from the main conflict graph display region, except for any shared vertex that is also included in a higher level conflict cycle.

At step 908, the system determines whether all of the conflict cycles have been separated (as shown in FIGS. 5C, 5E, and 5G, or as shown in FIGS. 6C, 6E and 6G). If they have not all been separated, steps 902-908 are repeated for each level of conflict cycle. The sequence either proceeds from inside to outside (as in FIGS. 5A-5G) or from outside to inside (as in FIGS. 6A-6G). If all have been entered, step 910 is performed.

At step 910, the identification of conflict cycle levels is completed. In some embodiments, all of FIGS. 5A-5G (6A-6G) remain on the display. In some embodiments, the summary view of FIG. 5H (6H) is displayed.

Figure 10:
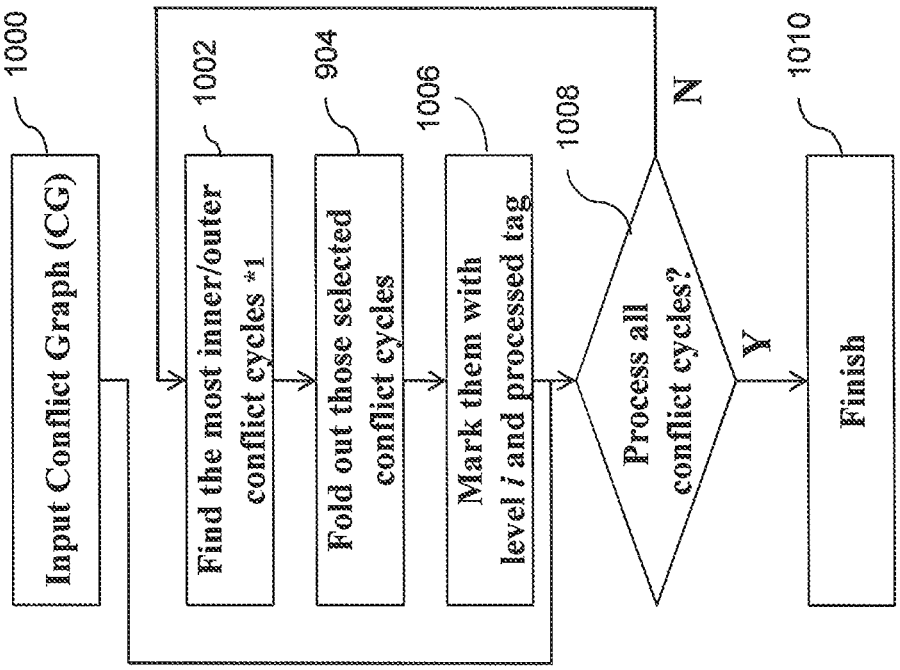
FIG. 10 is a flow chart for a method of forming the displays FIGS. 7A-8E.

FIG. 10 is a high-level flow chart of a method for providing automated suggestions for resolving the conflict cycles, as shown in FIGS. 7A to 8H.

At step 1000, the conflict graph information is input. This may include inputting a previously stored set of conflict cycle graphs (e.g., as shown in FIG. 7A), or processing the initial layout information from the EDA tool, to generate the conflict graphs anew. Step 1000 is performed once. Then control is passed to step 1008 for the main loop.

At step 1002, either the innermost remaining level (classification) of conflict cycle is found (FIG. 7B) or the outermost conflict cycle is found (FIG. 8B).

At step 1004, the corresponding vertices and edges are folded or rotated out from the main conflict graph display region, pivoting around any shared vertex that is also included in a higher level conflict cycle.

At step 1006, the level i determined at step 1002 is marked with an indicia of "Level i" and displayed.

At step 1008, the system determines whether all of the conflict cycles have been separated (as shown in FIG. 7E or as shown in 8E). If they have not all been separated, steps 1002-1008 are repeated for each level of conflict cycle. The sequence either proceeds from inside to outside (as in FIGS. 7A-7E) or from outside to inside (as in FIGS. 8A-8E). If all have been processed, step 1010 is performed.

At step 1010, the identification of conflict cycle levels is completed.

Figure 11B:
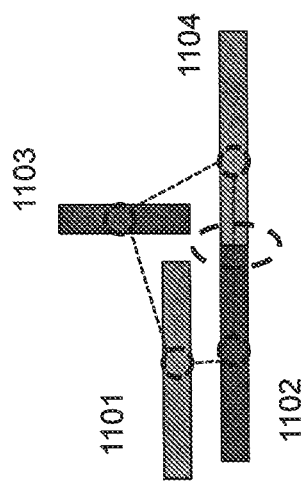
FIGS. 11A-11C show resolution of a DPT conflict cycle by changing an IC layout.
Figure 11C:
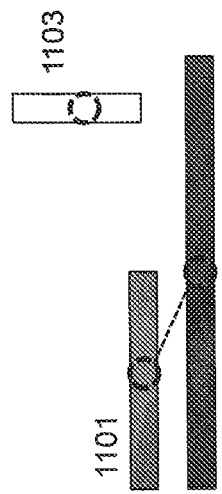
Figure 11A:
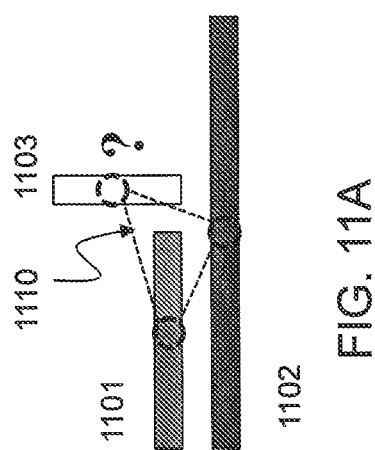

FIGS. 11A-11C show the two alternative types of changes to the circuit layout, which are suggested for resolving various conflict cycles.

FIG. 11A is an example of a set of circuit patterns which result in a DPT (M=2) conflict cycle. Respective pairs of patterns from the group consisting of patterns 1101-1103 are separated from each other by respective spacings less than the minimum separation distance (G0). The conflict cycle graph 1110 is also shown, including the vertices at the center of each pattern, and the edges connecting the vertices. If pattern 1101 is formed in a first mask, and pattern 1102 is formed in a second mask, pattern 1103 cannot be placed on either mask to be formed clearly using only two masks. This is an odd-loop conflict cycle.

FIG. 11B shows a resolution by splitting the vertex of polygon 1102 into two vertices. This corresponds to physically splitting the pattern 1104 into two portions, each to be formed by a separate photomask. The resulting final IC layer has the same patterns after the double exposure. Now patterns 1101 and 1104 are formed with the first mask, and patterns 1102 and 1103 are formed with the second mask. Splitting a vertex (inserting s stitch) changes an odd-loop cycle conflict into an even-loop cycle, as shown by the vertices ad edges in FIG. 11B.

FIG. 11C shows a resolution by removing at least one edge, in this case, removing two edges of the conflict cycle (so that it is no longer a conflict cycle). Removing an edge corresponds to increasing a spacing between polygons. In this example, the pattern 1103 is moved away from pattern 1101. This actually changes the patterns in the final IC layer.

Figure 12B:
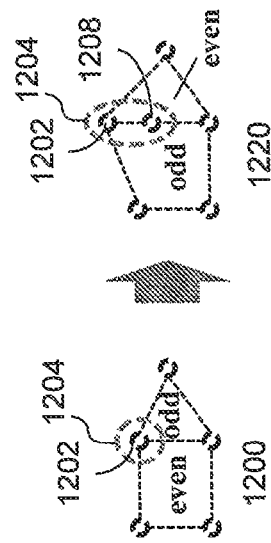
FIGS. 12A-12C show a display warning a user to avoid attempting a step that will not reduce a number of conflict cycles in a layout.
Figure 12A:
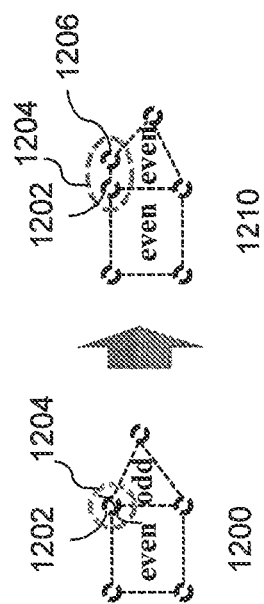
Figure 12C:
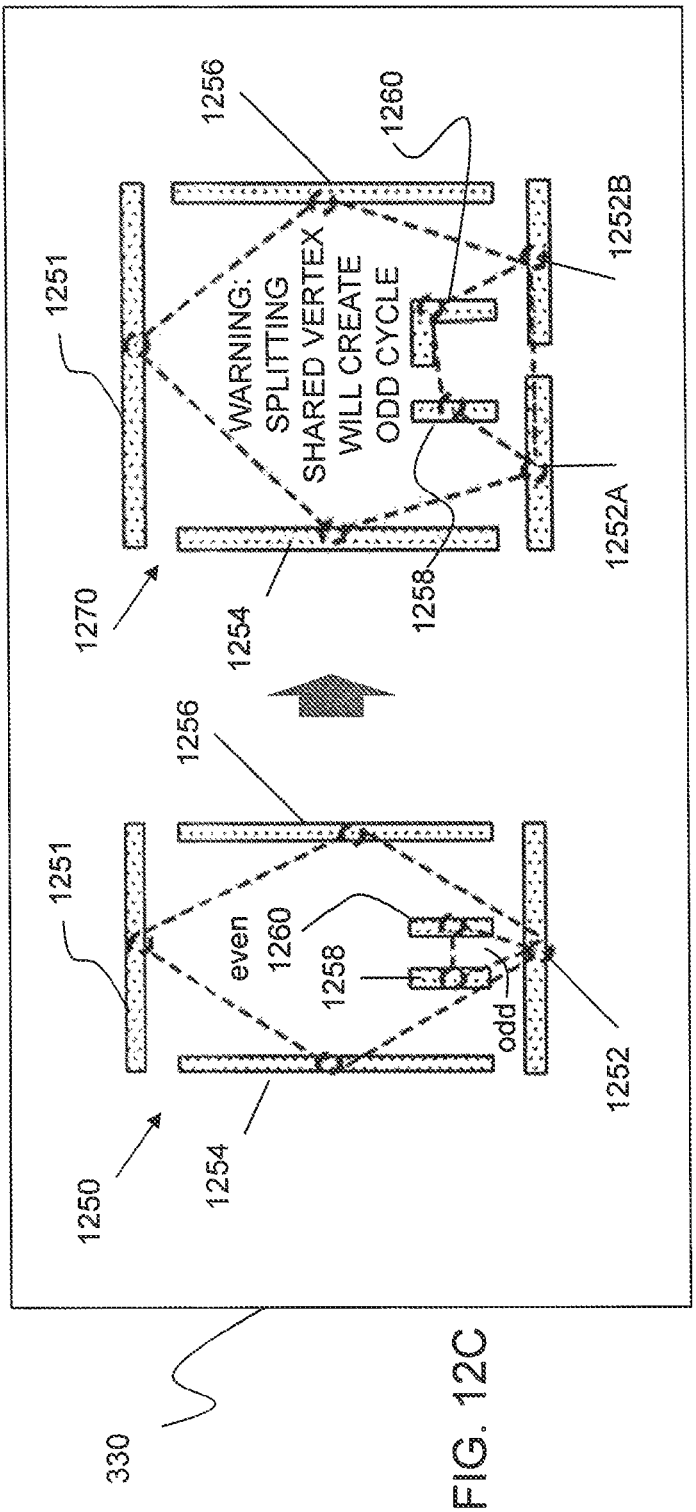

FIGS. 12A-12C show one automatically generated warning/suggestion for resolving an MPT conflict cycle, in which hierarchical conflict cycles have a shared vertex. When the system detects that two of the multi-patterning conflict cycle graphs have a shared vertex, and a first one of the multi-patterning conflict cycle graphs having the shared vertex is an odd loop and the second one of the multi-patterning conflict cycle graphs having the shared vertex is an even loop. The system displays a warning indicating that the shared vertex should not be resolved by a stitch that adds a vertex to the second multi-patterning conflict cycle graph.

FIGS. 12A-12B show the method in a graphical format. FIG. 12C shows the mapping between the graphical level and the physical circuit layout level. In some embodiments, the warning is displayed in a pure graphical format, as shown in FIGS. 12A-12B. In some embodiments, the warning is shown in a layout format, as shown in FIG. 12C.

In FIG. 12A, two abutting conflict cycles are present: an odd loop cycle and an even loop cycle. The abutting conflict cycles share an edge and two vertices. The system automatically suggests a resolution. For example, a colored circle 1204 may indicate that the vertex 1202 should be split. Given a decision to split a vertex 1202 (i.e., insert a stitch), the additional vertex may be added in the odd-cycle loop, which resolves the conflict cycle, as shown in FIG. 12A. Splitting this vertex (polygon) and inserting the added vertex 1206 in the odd loop resolves the conflict cycle, so there are two even loop cycles.

Alternatively, as shown in FIG. 12B, splitting the same vertex 1202 and inserting the added vertex 1206 along the shared edge changes the odd loop cycle into an even loop cycle, but also changes the even loop cycle into an odd loop cycle. In one embodiment, the system displays FIG. 12A and/or FIG. 12B, with or without an appropriate text warning.

In some embodiments, in FIG. 12C, the system can optionally automatically generate and display a warning to avoid the situation of FIG. 12B, where the user resolves one odd-loop cycle but creates another. In FIG. 12C, a conflict cycle graph 1250 has polygons 1251, 1252, 1254, 1256, 1258 and 1260, forming an odd loop and an even loop as shown. The odd loop and even loop share a vertex 1252. In some embodiments, the system automatically generates a warning graph, such as that shown in FIG. 12C. The warning displays the graph that would result if the shared vertex 1252 is split into two vertices 1252A and 1252B. The four sided even loop would become a five-sided odd loop.

FIGS. 13A-13D and 14A-14D show one form of suggested resolution for two abutting odd-loop conflict cycles which share a common side having one or more edges.

FIG. 13A shows two adjacent odd-loop conflict cycles which share a common side comprising three individual edges 1301-1303. In FIG. 13A, the system generates a display in which the three edges 1301-1303 are highlighted (e.g., by color), indicating that the odd loop conflict cycles can be resolved by removing any of these three common edges (corresponding to an increase in a distance between any of the pairs of vertices connected by edges 1301-1303. The system suggests that the user resolve the odd-odd loop configuration with high priority, by eliminating part or all of the common edge from the conflict graph. Examples of methods for eliminating the common edge are provided in FIGS. 13B-13D and 14B-14D.

FIG. 14A shows a layout corresponding to the graph of FIG. 13A, including the suggested resolution. In this example, the sub-G0 spacings 1410 are highlighted (e.g., by a red colored display or distinctive marker). This tells the user that the highest priority conflict cycle remaining in the layout can be resolved by increasing any of these three spacings 1410. The spacings 1410 also correspond to the edges 1301-1303. Polygons 1401 and 1402 are shown, connected to the edges 1301-1303. Note that for purpose of graphing the layout of FIG. 14B, the conflict cycle containing edges 1301-1303 are folded out. (Or, for purpose of constructing the conflict cycle graph of FIG. 13A, the polygons 1401-1402 of FIG. 14A are folded in.) For purpose of the conflict cycle analysis, the folding does not affect the conflict cycle relationships. That is, FIGS. 13A-13D are equivalent to FIGS. 14A-14D from a conflict cycle standpoint, even though the graph in FIG. 13A has the edges 1301-1303 in the middle, and the layout of FIG. 14A has the polygons 1401, 1402 connected to the edges 1301-1303 on the left side.

FIG. 13B shows the configuration after edge 1303 is removed. This corresponds to a layout change, such as shortening the polygon 1402 of FIG. 14A to the length of polygon 1402s in FIG. 14B. In FIG. 14B, the distance between polygon 1402s and the bottom polygon 1404 is greater than or equal to the minimum separation distance, so there is only a single even loop cycle.

FIG. 13C shows the configuration after edge 1302 is removed. This corresponds to a layout change, such as shortening the polygon 1401 and/or 1402 of FIG. 14A to the lengths of polygons 1401s and 1402s in FIG. 14C. This increases the distance between polygons 1401s and 1402s to be greater than or equal to the minimum separation distance, so there is only a single even loop cycle.

FIG. 13D shows the configuration after edge 1303 is removed. This corresponds to a layout change, such as shortening the polygon 1401 of FIG. 14D to the length 1401s, to increase the distance between polygon 1401s and polygon 1405, as shown in FIG. 14D to be greater than or equal to the minimum separation distance, so there is only a single even loop cycle.

The system provides suggestions and/or warnings for three different types of abutting odd and even loop combinations. FIGS. 15A-15E show the first type of abutting odd and even loop combination, including an even loop abutting a single odd loop. When the system detects that the multi-patterning conflict cycle graphs include a first multi-patterning conflict cycle graphs which is an odd loop, and a second multi-patterning conflict cycle graphs which is an even loop, where the first and second multi-patterning conflict cycle graphs share at least one edge, the system displays a warning that removing a single shared edge will not resolve both the multi-patterning conflict cycles represented by the first and second step multi-patterning conflict cycle graphs.

FIG. 15A shows the single odd loop 1504 abutting the even loop. The two loops share a side having three connected edges 1506, 1508, 1510. These edges may be highlighted with an indicator to warn the user not to try to resolve the conflict cycle by removing one of the edges 1506, 1508, 1510. FIGS.

15B and 15C show why removing one or more of the edges 1506, 1508, 1510 still does not resolve the conflict. In FIG. 15B, all three edges 1506, 1508, 1510 are removed (e.g., by increasing spacings). The remaining edges form a single pentagon 1512, which is another odd loop conflict cycle. Similarly, FIG. 15C shows that removing only one of the three edges 1506, 1508, 1510 has the same effect. When edge 1508 is removed, the remaining edges form a single pentagon 1512, which is another odd loop conflict cycle.

FIG. 15D shows a warning that can be displayed for the user. The relevant portion of the layout is displayed, along with markers 1520, 1522, 1524 corresponding to the three edges 1506, 1508, 1510. A heavy dashed line 1530 or other indicator, which may have a distinctive color, warns the user that removing one or more of the edges 1506, 1508, 1510 still does not resolve the conflict. In some embodiments, only FIG. 15D is displayed. In other embodiments, FIG. 15E is also displayed. FIG. 15E shows the user the expected result that would occur if the user chooses to remove one of the edges in spite of the warning in FIG. 15D. FIG. 15E shows that a five-sided odd loop conflict cycle would still remain.

Thus warned, the user can take an appropriate action, such as splitting a vertex, so the added vertex is located in one of the non-shared sides 1514 (FIG. 15A) of the original odd loop. This corresponds to inserting s stitch in side 1526 (FIG. 15D).

In some embodiments, the system displays the graph format of FIGS. 15A-15C. In some embodiments, the system displays the layout format of FIGS. 15D-15E. In other embodiments, the system displays both formats, the increase the clarity and ease of understanding of the suggestions to the user.

FIGS. 16A to 16D show the next highest priority abutting odd and even loop combinations. FIGS. 16A to 16D show the second type of abutting odd and even loop combination, including an even loop 1602 abutting plural odd loops 1604, 1606, 1608. In this situation, the system highlights certain shared sides, to suggest that the user remove an even number of edges in a respective even number of shared sides of the even loop cycle. If a single shared edge is removed to break one of the odd cycles, this will induce an odd loop. But if two shared edges are removed to break two odd loops, the result is an even loop, eliminating two conflict cycles without creating a new one.

The system detects that the multi-patterning conflict cycle graphs include a first multi-patterning conflict cycle graph which is an even loop, and second and third multi-patterning conflict cycle graphs which are odd loops, where the first and second multi-patterning conflict cycle graphs share one or more first edges, and the first and third multi-patterning conflict cycle graphs share one or more second edges. The system displays a suggestion that the user resolve the multi-patterning conflicts by changing the layout so as to remove at least one of the first edges and at least one of the second edges from the multi-patterning conflict cycle graphs.

In FIG. 16A, there are three odd loops 1604, 1606, 1608 abutting even loop 1602, each odd loop sharing at least one edge 1603 or 1605 with the even loop 1602. In FIG. 16A, the shared edges 1603, 1605 are highlighted, for example by a distinctive color, distinctive dash/dot format, or the like. This tells the user that the user should remove two of these edges on two of the shared sides of the even loop, to resolve the highest priority conflict cycle. For example, FIG. 16B shows the result of removing the two edges 1603. Two of the odd loop conflict cycles are removed, without introducing any new odd loop conflict cycle.

FIGS. 16C and 16D show the layout view format of the graphically displayed suggestion for resolving a configuration having an even loop cycle and two abutting odd loop cycles. The system displays the even loop cycle 1620, and the two abutting odd loop cycles 1622, 1624, along with the polygons that are represented by the vertices. The system displays the sub-G0 spacings 1630, 1632. In this situation, the system uses the special indicia 1632 to tell the user that both of these edges should be removed, thus eliminating two odd loop conflict cycles. For example, the user can shorten the polygons 1640, 1642 to the lengths of polygons 1640s, 1642s. The result is shown in FIG. 16D. The two odd loop conflict cycles 1622, 1624 are eliminated, leaving only an even loop cycle, which is not a conflict cycle.

In some embodiments, the system displays the graph format of FIGS. 16A-16B. In some embodiments, the system displays the layout format of FIGS. 16C-16D. In other embodiments, the system displays both formats, the increase the clarity and ease of understanding of the suggestions to the user.

FIGS. 17A-17D cover the automated suggestions graphically displayed to the user for resolving a configuration where an even loop cycle has two sides abutting respective odd-loop conflict cycles, and the two odd loop conflict cycles share a common vertex. The system detects that the multi-patterning conflict cycle graphs include a first multi-patterning conflict cycle graph which is an even loop, and second and third multi-patterning conflict cycle graphs which are odd loops, where the first and second multi-patterning conflict cycle graphs share a first edge, the first and third multi-patterning conflict cycle graphs share a second edge, and the first and second edges share a vertex. Then the system displays a suggestion that the user resolve the multi-patterning conflicts by changing the layout so as to remove the vertex from the multi-patterning conflict cycle graphs (which also removes the first and second edges sharing that vertex).

The system displays a distinctive marker 1720 telling the user that the highest priority change is to remove at least one edge from the two sides of the even loop cycle which are shared with the two odd loop conflict cycles respectively.

FIG. 17A shows an even loop cycle 1702 which is abutted by two odd loop conflict cycles 1703, 1705. The even loop 1702 shares edges 1710 and 1712 of the odd-loop conflict cycles 1703, 1705, respectively. A distinctive marker (e.g., distinctive color or shape) 1720 is displayed. This tells the user to remove the two shared edges 1710, 1712 which are connected to the vertex having the marker 1720.

FIGS. 17C and 17D show a layout view of an example corresponding to the graphs in FIGS. 17A and 17B, respectively. The marker 1720 tells the user to remove the edges 1710 and 1712. As shown in FIG. 17D, this can be accomplished by changing at least one length and/or at least one spacing between polygons. In FIG. 17D, the spacing between polygons 1730 and 1732 is increased (e.g., by shortening polygon 1730), and the spacing between polygons 1730 and 1734 is increased (e.g., by re-routing polygon 1730 so as not to approach within the minimum separation distance of polygon 1734. As a result, the two odd-loop conflict cycles are eliminated, and the remaining 6-sided even loop cycle does not include a conflict cycle.

Figure 18:
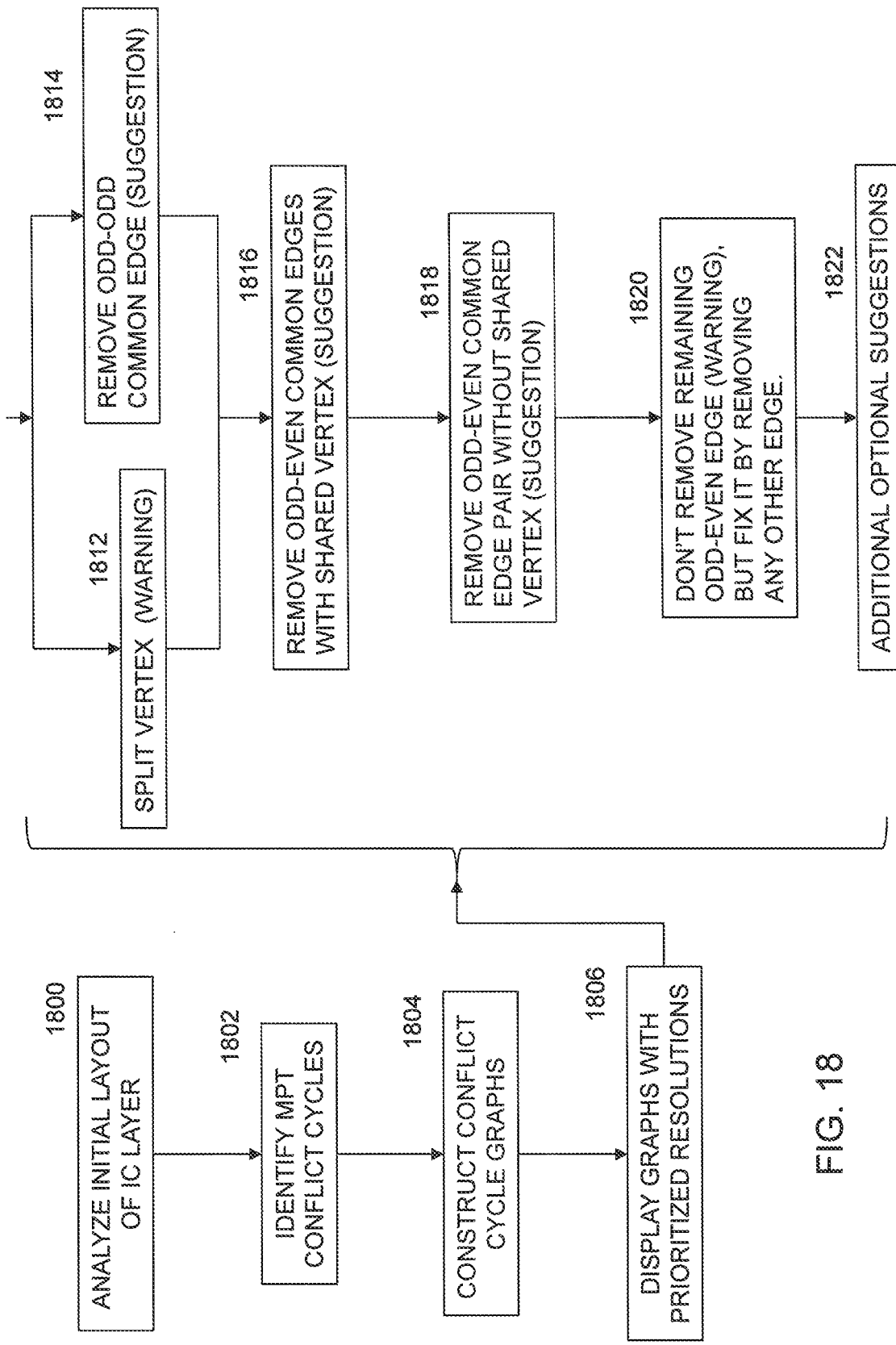
FIG. 18 is a flow chart for determining the priority-ordered sequence in which the various conflict cycle resolution warnings and suggestions of FIGS. 12A-17D are rendered and displayed to the user.

FIG. 18 is a flow chart showing the high level procedure used by the system to decide which automated suggestions/warnings to display to the user, and in which order. These warnings and suggestions are provided in a prioritized sequence. In some embodiments, the priorities are as indicated by the relative positions in FIG. 18, from the highest priority (steps 1812, 1814) to the lowest priority (step 1820).

At step 1800, the system analyzes an initial layout of an integrated circuit pattern layer having a plurality of polygons At step 1802, identifies a plurality of multi-patterning conflict cycles in the initial layout.

At step 1804, the system constructs in the computer a respective multi-patterning conflict cycle graph representing each identified multi-patterning conflict cycle.

At step 1806, the system causes a display device to graphically display the plurality of multi-patterning conflict cycle graphs, including successively displaying suggestions for which multi-patterning conflict cycle graph should be resolved next, according to a prioritized order. In some embodiments, step 1806 in turn includes steps any of steps 1812-1822 which are applicable for the layout being processed.

At step 1812, the system provides a graphical warning that, if the user wishes to split a vertex shared by odd and even loops, the user should not insert the additional vertex into any edge of the shared side where the even loop abuts the odd loop (because doing so would change the even loop to an odd-loop conflict cycle). An example of the warning is shown in FIG. 12C.

At step 1814 of FIG. 18, if there are two abutting odd-loop conflict cycles, the system graphically displays a suggestion to remove a common edge in the abutting sides of the two odd-loop conflict cycles. An example is shown in FIGS. 13A-14D.

At step 1816 of FIG. 18, after step 1814, the system analyzes the remaining layout and identifies any abutting odd and even loops with a shared vertex. The system graphically displays a suggestion to remove the common edges which are connected to the shared vertex, as shown in FIGS. 17A-17D.

At step 1818 of FIG. 18, after step 1816, the system analyzes the remaining layout and identifies any abutting odd and even loops without a shared vertex. The system graphically displays a suggestion to remove a pair of common edges (between the even loop and two of the odd-loop conflict cycles, as shown in FIGS. 16A-16D.

At step 1820 of FIG. 18, after step 1818, the system analyzes the remaining layout and identifies any single odd loop abutting a single even loop, where the two loops do not share a common vertex. The system graphically displays a warning that the user should not try to resolve this conflict by removing a shared edge from the abutting sides of the odd and even loops (since doing so leaves one large odd-loop conflict cycle).

At step 1822, after performing the prioritized suggestions and warnings for the hierarchical conflict cycles, the system optionally provides additional suggestions shown in FIGS. 19A-20B. These suggestions can be applied to any conflict cycle, regardless of whether there are plural hierarchical (nested) conflict cycles.

Figure 19A:
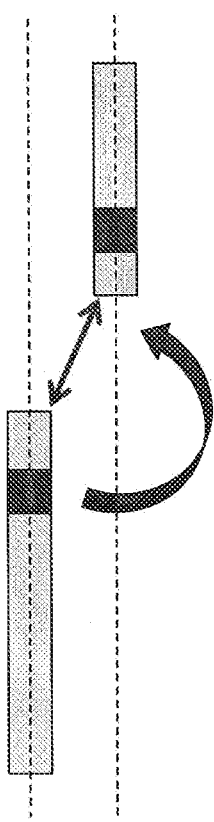
FIGS. 19A-19D show examples of optional additional suggestions to be provided after the suggestions of FIGS. 17A-17D.

FIG. 19A shows a graphical display of a pair of patterns for which the line end corner-to-corner distance is less than the minimum separator distance. The graphical display tells the user that a conflict cycle can be resolved by increasing the separation between these two patterns (e.g., by moving one or both, or by changing a length of one or both polygons). This is equivalent to removing an edge of a conflict cycle graph.

Figure 19B:
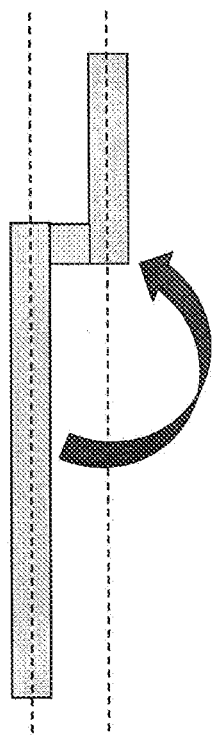

FIG. 19B shows a graphical display of an odd track jog routing, suggesting a change in the jog. A conflict cycle containing such a pattern can often be resolved by changing the odd track jog routing to an even track jog routing (i.e., change the length of the jog to be 2, 4, 6, . . . tracks).

Figure 19C:
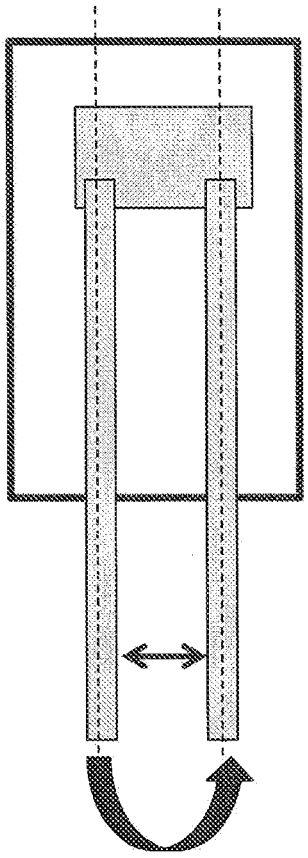

FIG. 19C shows a situation in which the pins to a standard cell have an odd track space, but the patterns inside the standard cell may be incompatible with the odd track spacing. This display tells the user that the conflict cycle may be resolved by routing the pins of the standard cell in another layer (e.g., by locating vias just outside of the standard cell). Once the patterns are routed to another metal layer, the conflict cycle is removed.

Figure 19D:
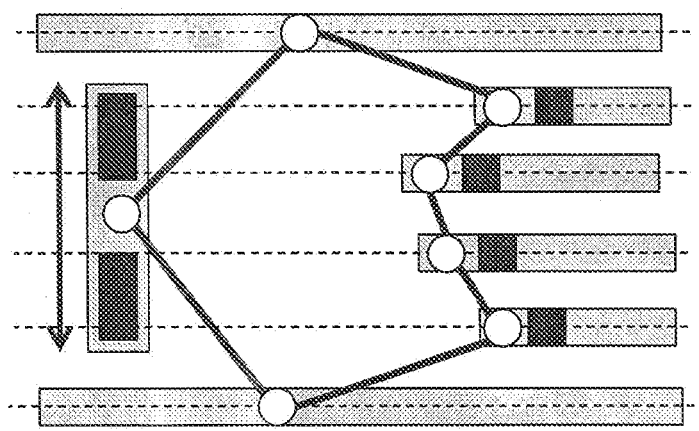

FIG. 19D shows a display telling the user that an even track power via array conflict cycle problem is present. The power via array is represented by the topmost vertex. If this power via array occupies even tracks, the surrounding polygons would induce an odd conflict cycle for DPT.

Figure 20B:
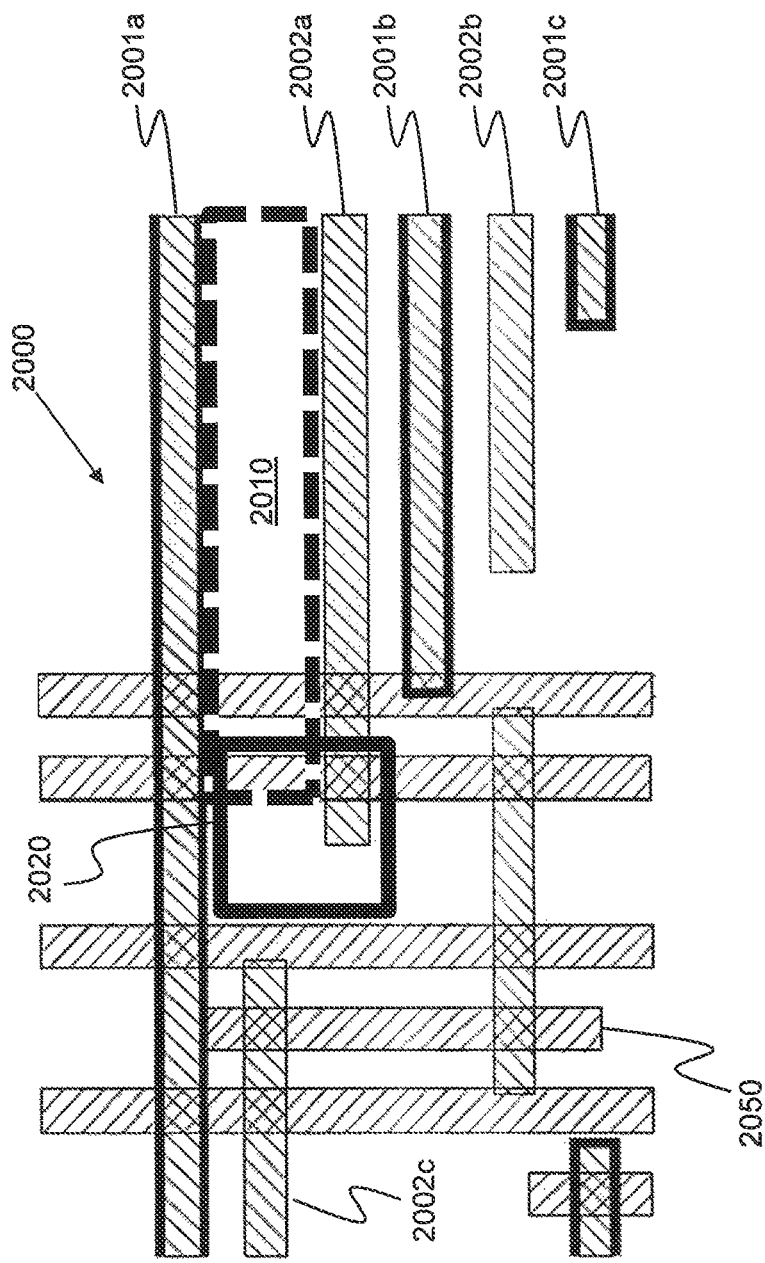

FIGS. 20A-20B show a method for providing coloring hints around spacing hotspots for effectively fixing MPT conflicts, using a layout format.

In FIG. 20A, the layout 2000 includes a layer with horizontal patterns of a first color 2001a-2001c and patterns of a second color 2002a-2002c. In some embodiment, the patterns around the detected MPT conflict cycles (but not other patterns) are displayed in two distinctive colors ("assistive colors"). For example, in one embodiment, patterns 2001a-2001c are displayed in a first color (e.g., blue), and patterns 2002a-2002c are displayed in a second color (e.g., yellow). Any other patterns within the display are shown in a different color (e.g., red). The coloring information assists the user in identifying the MPT conflict cycle.

One aspect of FIG. 20A provides "highlight by assistive colors" in a "smart region". Note that there may be no color (mask assignment) information on the layout patterns in the design flow. If coloring information is not previously provided, the system preliminarily inserts alternating colors in successive regions, and provides highlights to indicate conflicts.

FIG. 20A provides an "assistive coloring highlight" for the patterns around the detected MPT conflict cycles to help designers or tools clearly resolve the MPT conflict cycles.

In FIG. 20A, the region 2020 is highlighted since it is "the most easy-to-fix edge (see FIGS. 19A-19D)" of the conflict cycle 2010. For example, in some embodiments, the region 2020 is outlined in a different color from the rest of the display (e.g., red), The square 2020 (or another outline shape) identifies a specific region in which one or more polygons can most easily be moved, resized, or rerouted, to resolve the conflict cycle represented by region 2010.

The system smartly displays the "assistive coloring highlight" 2020 such that the coloring conflict between 2002c and 2002a patterns are precisely located in the hotspot highlight region 2020.

In this way, the designers can quickly identify the region 2020 and fix it by the assistive colors applied to the patterns around region 2020.

FIG. 20A also shows a region 2010 which is optionally highlighted to show a conflict cycle in layout format. This region 2010 follows the edges of the patterns 2001a, 2002a and 2002c, which are spaced from each other by less than the minimum separation distance and form an odd loop. In some embodiments, conflict cycle region 2010 is displayed in a color that is different from any of the polygons 2001a-2001c, 2002a-200c, and which is different from the color of the region 2020 (e.g., white).

FIG. 20B shows a suggested layout change that is displayed to the user. In this example, only the patterns 2002c and 2050 are changed. The edge connecting patterns 2002a and 2002c is eliminated, resolving the odd loop conflict cycle.

Having successfully used the tool described herein, the layout is now ready for multi-patterning decomposition.

In some embodiments, a computer implemented method comprises: (a) analyzing in a computer an initial layout of an integrated circuit pattern layer having a plurality of polygons, so as to identify a plurality of multi-patterning conflict cycles in the initial layout; (b) constructing in the computer a respective multi-patterning conflict cycle graph representing each identified multi-patterning conflict cycle; (c) classifying each identified multi-patterning conflict cycle graph in the computer according to a number of other multi-patterning conflict cycle graphs which enclose that multi-patterning conflict cycle graph; and (d) causing a display device to graphically display the plurality of multi-patterning conflict cycle graphs according to their respective classifications.

In some embodiments, a computer implemented method comprises: (a) analyzing in a computer an initial layout of an integrated circuit pattern layer having a plurality of polygons, so as to identify a plurality of multi-patterning conflict cycles in the initial layout; (b) constructing in the computer a respective multi-patterning conflict cycle graph representing each identified multi-patterning conflict cycle; and (c) causing a display device to graphically display the plurality of multi-patterning conflict cycle graphs, including successively displaying suggestions for which multi-patterning conflict cycle graph should be resolved next, according to a prioritized order.

In some embodiments, a computer implemented system comprises: a tangible, non-transitory computer readable storage medium encoded with data representing an initial layout of an integrated circuit pattern layer having a plurality of polygons. A special-purpose computer is configured to perform the steps of: analyzing in the initial layout of an integrated circuit pattern layer having a plurality of polygons, so as to identify a plurality of multi-patterning conflict cycles in the initial layout; constructing in the computer a respective multi-patterning conflict cycle graph representing each identified multi-patterning conflict cycle; classifying each identified multi-patterning conflict cycle graph in the computer according to a number of other multi-patterning conflict cycle graphs which enclose that multi-patterning conflict cycle graph; and causing a display device to graphically display the plurality of multi-patterning conflict cycle graphs according to their respective classifications.

The methods and system described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, wherein, when the computer program code is loaded into and executed by a computer, the computer becomes an apparatus for practicing the method. The methods may also be at least partially embodied in the form of a computer into which computer program code is loaded and/or executed, such that, the computer becomes a special purpose computer for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although the subject matter has been described in terms of exemplary embodiments, it is not limited thereto. Rather, the appended claims should be construed broadly, to include other variants and embodiments, which may be made by those skilled in the art.

What is claimed is:

1. A computer implemented method, comprising:
   (a) analyzing in a computer an initial layout of an integrated circuit pattern layer having a plurality of polygons, so as to identify a plurality of multi-patterning conflict cycles in the initial layout;
   (b) constructing in the computer a respective multi-patterning conflict cycle graph representing each identified multi-patterning conflict cycle;
   (c) classifying each identified multi-patterning conflict cycle graph in the computer according to a number of other multi-patterning conflict cycle graphs which enclose that multi-patterning conflict cycle graph;
   (d) causing a display device to graphically display the plurality of multi-patterning conflict cycle graphs according to their respective classifications;
   wherein before step (d), prompting a user to input a number N of classifications to be displayed at any given time; and
   wherein step (d) includes initially displaying those multi-patterning conflict cycle graphs having the first N classifications.

2. The method of claim 1, wherein each multi-patterning conflict cycle graph has vertices representing respective ones of the plurality of polygons and edges representing separation between two of the polygons smaller than a minimum separation distance for patterning in a single mask; and
   step (d) includes displaying an indication that one of the vertices is shared by at least two of the multi-patterning conflict cycle graphs.

3. The method according to claim 2, wherein step (d) further includes displaying a suggestion that the user resolve the one vertex shared by the at least two of the multi-patterning conflict cycle graphs by inserting a stich in the polygon represented by the one vertex.

4. The method of claim 1, further comprising:
   prompting the user to input a change for resolving one of the multi-patterning conflict cycles currently being displayed;
   receiving the change input by the user;
   discontinuing displaying the resolved multi-patterning conflict cycle; and
   adding those multi-patterning conflict cycle graphs having the N+1th classification to the those remaining multi-patterning conflict cycle graphs being displayed.

5. The method of claim 1, wherein step (d) includes,
   initially displaying all of the plurality of multi-patterning conflict cycle graphs in a combined graph; and then
   for each classification, successively separately displaying each multi-patterning conflict cycle graph having that classification, one classification at a time.

6. The method of claim 5, wherein step (d) includes:
   as each multi-patterning conflict cycle graph is separately displayed, deleting that multi-patterning conflict cycle graph from the combined graph, while continuing to display a remainder of the combined graph.

7. The method of claim 1, wherein:
   each multi-patterning conflict cycle graph has vertices representing respective ones of the plurality of polygons and edges representing separation between two of the polygons smaller than a minimum separation distance for patterning in a single mask; and
   step (d) includes, if at least one of the vertices is shared by at least two of the multi-patterning conflict cycle graphs, for each multi-patterning conflict cycle graph having the shared vertex, successively folding out the multi-patterning conflict cycle graphs having the at least one shared vertex, one classification at a time, until none of the multi-patterning conflict cycle graphs having the at least one shared vertex is displayed within any other multi-patterning conflict cycle graph.

8. The method of claim 1, wherein step (d) includes displaying each the multi-patterning conflict cycle graphs having each respective classification in a respectively different color.

9. The method of claim 1, further comprising displaying a suggested modification to at least one of the plurality of patterns.

10. A computer implemented method, comprising:
(a) analyzing in a computer an initial layout of an integrated circuit pattern layer having a plurality of polygons, so as to identify a plurality of multi-patterning conflict cycles in the initial layout;
(b) constructing in the computer a respective multi-patterning conflict cycle graph representing each identified multi-patterning conflict cycle;
(c) causing a display device to graphically display the plurality of multi-patterning conflict cycle graphs, including successively displaying suggestions for which multi-patterning conflict cycle graph should be resolved next, according to a prioritized order;
wherein before step (c), prompting a user to input a number N of classifications to be displayed at any given time;
wherein step (c) includes initially displaying those multi-patterning conflict cycle graphs having the first N classifications;
wherein each multi-patterning conflict cycle graph has vertices representing respective ones of the plurality of polygons and edges representing separation between two of the polygons smaller than a minimum separation distance for patterning in a single mask step (c) further includes:
detecting that two of the multi-patterning conflict cycle graphs have a shared vertex; and
if a first one of the multi-patterning conflict cycle graphs having the shared vertex is an odd loop and the second one of the multi-patterning conflict cycle graphs having the shared vertex is an even loop, displaying a warning indicating that the shared vertex should not be resolved by a stitch that adds a vertex to the second multi-patterning conflict cycle graph.

11. The method of claim 10, wherein each multi-patterning conflict cycle graph has vertices representing respective ones of the plurality of polygons and edges representing separation between two of the polygons smaller than a minimum separation distance for patterning in a single mask, and step (c) further includes:
detecting that the multi-patterning conflict cycle graphs include a first multi-patterning conflict cycle graphs which is an odd loop, and a second multi-patterning conflict cycle graphs which is an even loop, where the first and second multi-patterning conflict cycle graphs share at least one edge; and
displaying a warning that removing a single shared edge will not resolve both the multi-patterning conflict cycles represented by the first and second step multi-patterning conflict cycle graphs.

12. The method of claim 10, wherein each multi-patterning conflict cycle graph has vertices representing respective ones of the plurality of polygons and edges representing separation between two of the polygons smaller than a minimum separation distance for patterning in a single mask; and step (c) further includes:

detecting that the multi-patterning conflict cycle graphs include a first multi-patterning conflict cycle graph which is an even loop, and second and third multi-patterning conflict cycle graphs which are odd loops, where the first and second multi-patterning conflict cycle graphs share one or more first edges, and the first and third multi-patterning conflict cycle graphs share one or more second edges; and
displaying a suggestion that the user resolve the multi-patterning conflicts by changing the layout so as to remove at least one of the first edges and at least one of the second edges from the multi-patterning conflict cycle graphs.

13. The method of claim 10, wherein each multi-patterning conflict cycle graph has vertices representing respective ones of the plurality of polygons and edges representing separation between two of the polygons smaller than a minimum separation distance for patterning in a single mask; and step (c) further includes:
detecting that the multi-patterning conflict cycle graphs include a first multi-patterning conflict cycle graph which is an even loop, and second and third multi-patterning conflict cycle graphs which are odd loops, where the first and second multi-patterning conflict cycle graphs share a first edge, the first and third multi-patterning conflict cycle graphs share a second edge, and the first and second edges share a vertex; and
displaying a suggestion that the user resolve the multi-patterning conflicts by changing the layout so as to remove the shared vertex from the multi-patterning conflict cycle graphs.

14. The method of claim 10, wherein each multi-patterning conflict cycle graph has vertices representing respective ones of the plurality of polygons and edges representing separation between two of the polygons smaller than a minimum separation distance for patterning in a single mask, and the prioritized order of step (c) includes the following sequence, each of the following steps that apply to the layout:
displaying a warning that a user should not split a vertex if doing so would change one of the multi-patterning conflict cycle graphs into an odd-cycle loop;
displaying a suggestion that the user remove a common edge shared by two of the multi-patterning conflict cycle graphs which are odd cycle loops;
displaying a suggestion that the user remove common edges and all included common vertices shared by two of the multi-patterning conflict cycle graphs, one of which is an odd cycle loop and the other of which is an even cycle loop;
displaying a warning that the user should not remove common edges shared by two of the multi-patterning conflict cycle graphs, one of which is an odd cycle loop and the other of which is an even cycle loop, where the common edges do not share a common vertex; and
displaying a warning that the user should not remove a common edge shared by two of the multi-patterning conflict cycle graphs, one of which is an odd cycle loop and the other of which is an even cycle loop, if removing the common edge would not resolve both of the two multi-patterning conflict cycle graphs.

15. The method of claim 10, wherein the step of successively displaying suggestions includes:
displaying a layout view of patterns around one of the multi-patterning conflict cycles using assistive coloring highlights; and graphically identifying a recommended edge or vertex to be changed in the layout view by displaying an outline around a portion of the layout to be changed.

16. A computer implemented system, comprising:
- a tangible, non-transitory computer readable storage medium encoded with data representing an initial layout of an integrated circuit pattern layer having a plurality of polygons;
- a special-purpose computer configured to perform the steps of:
  - analyzing in the initial layout of an integrated circuit pattern layer having a plurality of polygons, so as to identify a plurality of multi-patterning conflict cycles in the initial layout;
  - constructing in the computer a respective multi-patterning conflict cycle graph representing each identified multi-patterning conflict cycle;
  - classifying each identified multi-patterning conflict cycle graph in the computer according to a number of other multi-patterning conflict cycle graphs which enclose that multi-patterning conflict cycle graph;
  - causing a display device to graphically display the plurality of multi-patterning conflict cycle graphs according to their respective classifications;
- wherein the computer is configured to prompt the user to input a number N of classifications to be displayed at any given time; and
- wherein the computer is configured to initially display those multi-patterning conflict cycle graphs having the first N classifications.

17. The system of claim 16, wherein each multi-patterning conflict cycle graph has vertices representing respective ones of the plurality of polygons and edges representing separation between two of the polygons smaller than a minimum separation distance for patterning in a single mask; and
the computer causes the display device to display:
- an indication that one of the vertices is shared by at least two of the multi-patterning conflict cycle graphs, and
- a suggestion that the user resolve the one vertex shared by the at least two of the multi-patterning conflict cycle graphs by inserting a stitch in the polygon represented by the one vertex.

18. The system of claim 16, wherein the computer is configured to:
- prompt the user to input a change for resolving one of the multi-patterning conflict cycles currently being displayed;
- receive the change input by the user;
- discontinue displaying the resolved multi-patterning conflict cycle; and
- add those multi-patterning conflict cycle graphs having the N+1th classification to the those remaining multi-patterning conflict cycle graphs being displayed.

* * * * *